(12) United States Patent
Chen et al.

(10) Patent No.: US 12,431,476 B2
(45) Date of Patent: Sep. 30, 2025

(54) PIXEL PACKAGE, METHOD FOR FORMING THE SAME, AND DISPLAY DEVICE USING THE SAME

(71) Applicant: Lextar Electronics Corporation, Hsinchu (TW)

(72) Inventors: Fu-Hsin Chen, Hsinchu (TW); Yu-Chun Lee, Hsinchu (TW); Cheng-Ta Kuo, Hsinchu (TW); Jian-Chin Liang, Hsinchu (TW); Tzong-Liang Tsai, Hsinchu (TW); Shiou-Yi Kuo, Hsinchu (TW); Chien-Nan Yeh, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 659 days.

(21) Appl. No.: 17/739,310

(22) Filed: May 9, 2022

(65) Prior Publication Data
US 2023/0260979 A1  Aug. 17, 2023

(30) Foreign Application Priority Data
Feb. 15, 2022 (TW) .................. 111105369

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/20* (2013.01); *H01L 24/95* (2013.01); *H10H 20/852* (2025.01); *H10H 20/856* (2025.01); *H10H 20/857* (2025.01); *H01L 24/19* (2013.01); *H01L 2224/19* (2013.01); *H01L 2224/215* (2013.01); *H01L 2224/95001* (2013.01);
(Continued)

(58) Field of Classification Search
CPC .... H01L 25/167; H01L 24/81; H01L 25/0753
See application file for complete search history.

(56) References Cited

U.S. PATENT DOCUMENTS 10,770,441 B2   9/2020   Kuo et al.
2003/0072153 A1* 4/2003   Matsui .................. F21V 29/89
                                          362/800

(Continued)

FOREIGN PATENT DOCUMENTS

WO    2021/100454 A1    5/2021

OTHER PUBLICATIONS

Chinese language office action dated Mar. 15, 2023, issued in application No. TW 111105369.
(Continued)

*Primary Examiner* — Shih Tsun A Chou
(74) *Attorney, Agent, or Firm* — McClure, Qualey & Rodack, LLP

(57) ABSTRACT

A pixel package is provided. The pixel package includes a flexible redistribution layer and a plurality of LED chips arranged on the surface of the flexible redistribution layer in a flip-chip manner. The pixel package also includes a plurality of light-adjusting layers respectively disposed on the LED chips. The pixel package further includes a plurality of flexible composite laminates disposed on the surface of the flexible redistribution layer and between the LED chips.

15 Claims, 21 Drawing Sheets

(51) Int. Cl.
  *H10H 20/01*    (2025.01)
  *H10H 20/851*   (2025.01)
  *H10H 20/852*   (2025.01)
  *H10H 20/856*   (2025.01)
  *H10H 20/857*   (2025.01)

(52) U.S. Cl.
  CPC ..... *H10H 20/0362* (2025.01); *H10H 20/0363* (2025.01); *H10H 20/0364* (2025.01); *H10H 20/8515* (2025.01)

(56) References Cited

U.S. PATENT DOCUMENTS

| | | | |
|---|---|---|---|
| 2015/0169011 A1* | 6/2015 | Bibl ................... | G04G 9/10 |
| | | | 345/175 |
| 2017/0012026 A1* | 1/2017 | Choi ................... | A61K 40/405 |
| 2017/0254518 A1 | 9/2017 | Vasylyev | |
| 2017/0294479 A1* | 10/2017 | Cha ................... | H10H 20/81 |
| 2019/0096864 A1 | 3/2019 | Huitema et al. | |
| 2019/0311989 A1* | 10/2019 | Hadizadeh ........ | H01L 21/4846 |
| 2021/0013379 A1 | 1/2021 | Tischler et al. | |
| 2021/0376211 A1 | 12/2021 | Song | |
| 2022/0181526 A1* | 6/2022 | Bohmer ............ | H10H 20/812 |
| 2024/0030205 A1* | 1/2024 | Long ................. | H01L 25/0753 |

OTHER PUBLICATIONS

Chinese language office action dated Aug. 19, 2022, issued in application No. TW 111105369.

* cited by examiner

PIXEL PACKAGE, METHOD FOR FORMING THE SAME, AND DISPLAY DEVICE USING THE SAME

CROSS REFERENCE TO RELATED APPLICATIONS

This application claims priority of Taiwan Patent Application No. 111105369, filed on Feb. 15, 2022, the entirety of which is incorporated by reference herein.

BACKGROUND

Technical Field

Embodiments of the present disclosure relate in general to a pixel package, and in particular they relate to an active micro LED pixel package, a method for forming the same, and a display device using the same.

Description of the Related Art

In order to improve the performance of light-emitting diode (LED) display screens, an LED display screen has been developed to have a small pitch. The LED display screen may be formed through, for example, chip-on-board (COB) technology or package-on-board (POB) technology. COB technology may, for example, stick multiple red, green, and blue light-emitting diode chips on a circuit board or a substrate; POB technology may, for example, integrate multiple LED chips in a pixel structure and form a pixel package, and then install the pixel package on a circuit board or a substrate.

The traditional pixel package is a passive structure and cannot be controlled independently. Moreover, under certain requirements for color uniformity, the process yield of red and green LED chips is less than ideal. Furthermore, the conventional pixel package is not easily bent, and has disadvantages such as poor color point concentration and large color point shift.

SUMMARY

The embodiments of the present disclosure provide an active micro LED pixel package, a method for forming the same, and a display device using the same. In the embodiment of the present disclosure, the pixel package can be individually/independently controlled. Moreover, the pixel package according to the embodiment of the present disclosure includes a flexible redistribution layer (RDL) and flexible composite laminates, so that the whole pixel package may be easily bent. Furthermore, the flexible composite laminate between the LEDs may effectively improve the luminous efficiency of the pixel package and improve the contrast.

In some embodiments, the pixel package according to the embodiment of the present disclosure converts the light emitted by the LED chip (e.g., the LED chip that emits ultraviolet light) into light having a specific wavelength through the wavelength conversion layer. Under certain requirements for color uniformity, the pixel package according to the embodiment of the present disclosure has a better process yield than the conventional pixel package, and has the advantages of high color point concentration and small color point shift.

Some embodiments of the present disclosure include a pixel package. The pixel package includes a flexible redistribution layer and a plurality of LED chips arranged on the surface of the flexible redistribution layer in a flip-chip manner. The pixel package also includes a plurality of light-adjusting layers respectively disposed on the LED chips. The pixel package further includes a plurality of flexible composite laminates disposed on the surface of the flexible redistribution layer and between the LED chips.

Some embodiments of the present disclosure include a method for forming a pixel package. The method for forming the pixel package includes the following steps: providing a first temporary substrate; transferring a plurality of LED chips to the first temporary substrate; forming a plurality of light-adjusting layers on the LED chips; forming a plurality of flexible composite laminates on the first temporary substrate, wherein the flexible composite laminates are disposed between the LED chips; providing a second temporary substrate, wherein the second temporary substrate is adhered to top surfaces of the light-adjusting layers and the flexible composite laminates; removing the first temporary substrate from back sides of the LED chips and the flexible composite laminates; forming a flexible redistribution layer on the back sides of the LED chips and the flexible composite laminates; and removing the second temporary substrate from the top surfaces of the light-adjusting layers and the light-adjusting layers and the flexible composite laminates.

Some embodiments of the present disclosure include a display device. The display device includes a circuit substrate and a plurality of aforementioned pixel packages disposed on the circuit substrate.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
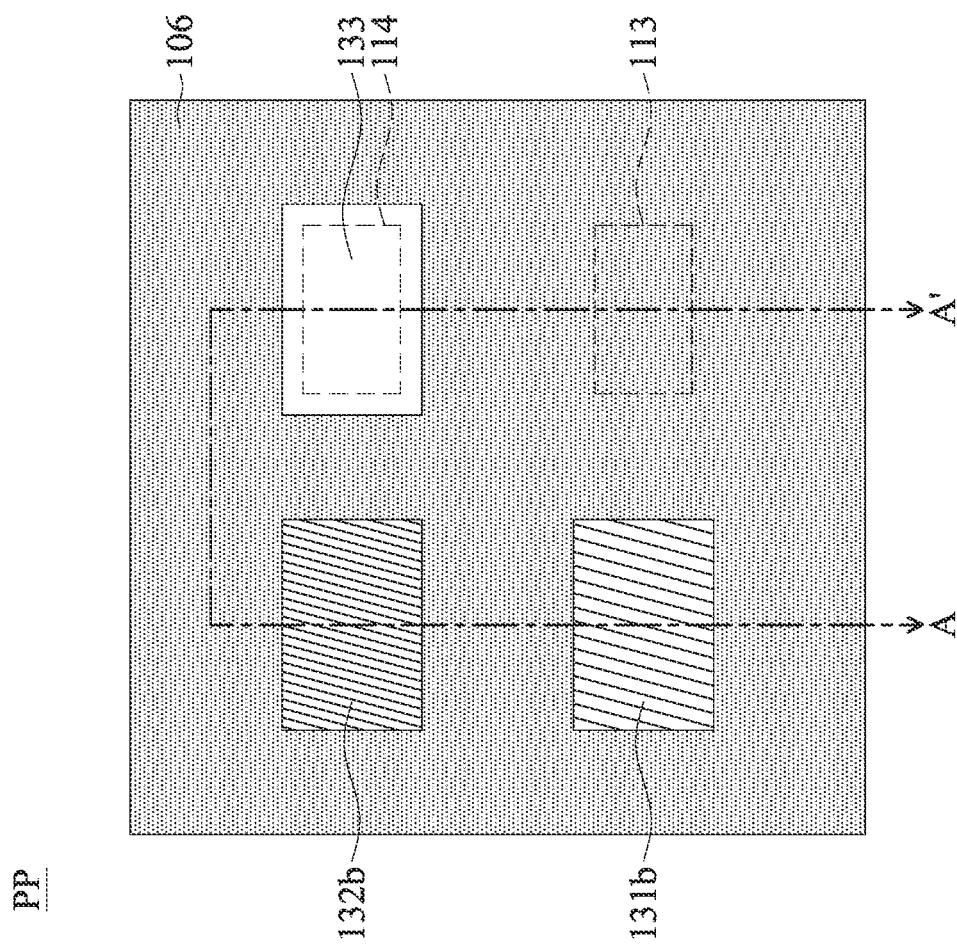
FIG. 1 is a partial top view illustrating the pixel package according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and the second feature are formed in direct contact, and may also include embodiments in which additional features may be formed between the first feature and the second feature, so that the first feature and the second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
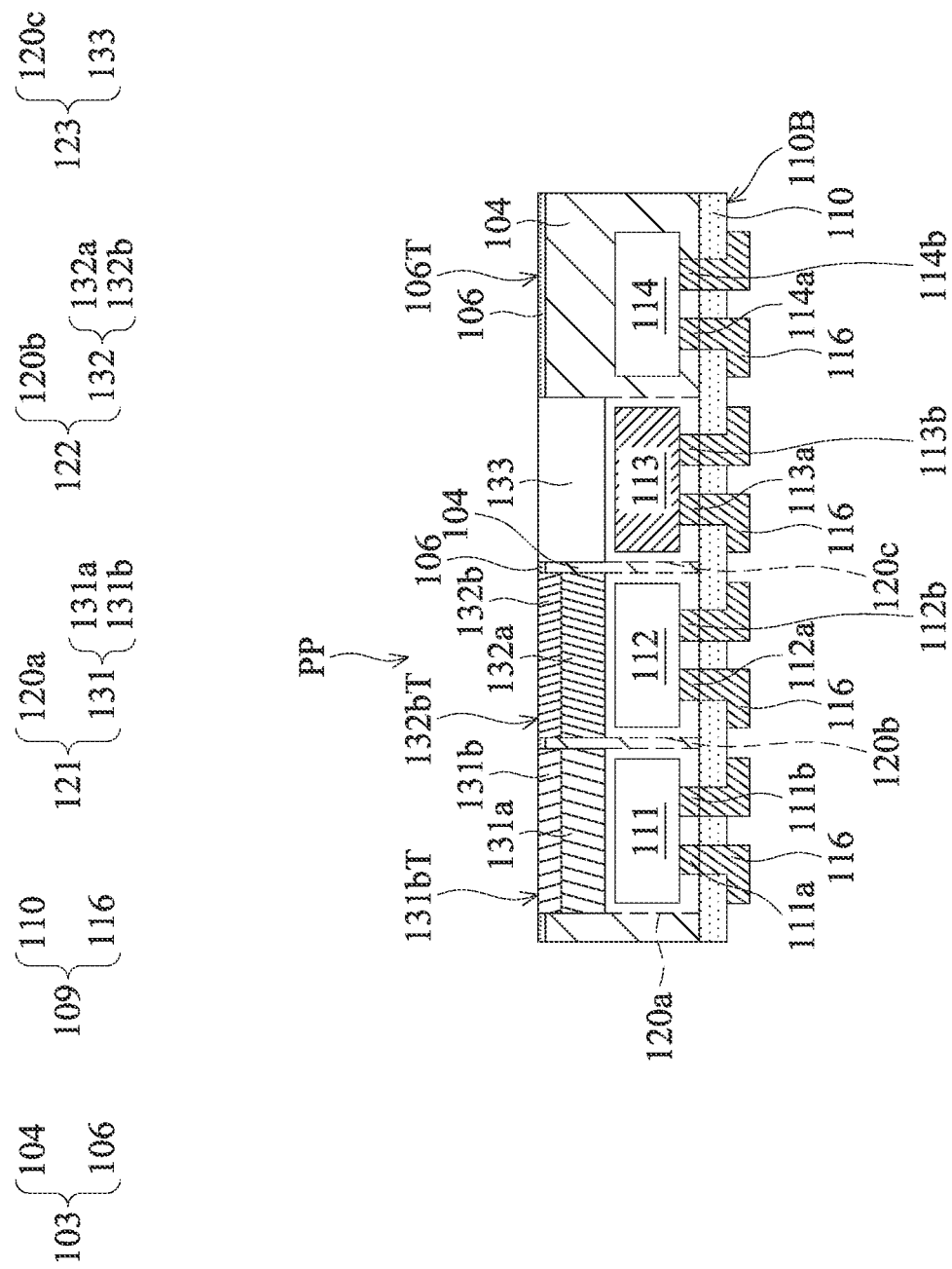
FIG. 2 is a partial cross-sectional view illustrating the pixel package according to some embodiments of the present disclosure.

FIG. 1 is a partial top view illustrating the pixel package PP according to some embodiments of the present disclosure. FIG. 2 is a partial cross-sectional view illustrating the pixel package PP according to some embodiments of the present disclosure. For example, the structure of the pixel package PP in FIG. 2 may be a partial cross-sectional view taken along line A-A' in FIG. 1, but the present disclosure is not limited thereto. It should be noted that some components of the pixel package PP have been omitted in FIG. 1 and FIG. 2 for sake of brevity.

As shown in FIG. 1 and FIG. 2, in some embodiments, the pixel package PP includes a flexible redistribution layer 109, a plurality of LED chips (e.g., first LED chip 111, second LED chip 112, and third LED chip 113), a plurality of light-adjusting layers (e.g., first light-adjusting layer 121, second light-adjusting layer 122, and third light-adjusting layer 123), and a plurality of flexible composite laminates 103. The first LED chip 111, the second LED chip 112, and the third LED chip 113 are arranged on the surface of the flexible redistribution layer 109 in a flip-chip manner, the first light-adjusting layer 121, the second light-adjusting layer 122, and the third light-adjusting layer 123 respectively disposed on the first LED chip 111, the second LED chip 112, and the third LED chip 113, and the flexible composite laminates 103 are disposed on the surface of the flexible redistribution layer 109 and between the first LED chip 111, the second LED chip 112, and the third LED chip 113.

In some embodiments, the LED chips emit blue light or ultraviolet (UV) light. For example, the first LED chip 111, the second LED chip 112, and the third LED chip 113 respectively emit a first light, a second light, and a third light, wherein the first light, the second light, and the third light may be blue light or ultraviolet light. As shown in FIG. 2, the first LED chip 111 includes two electrodes 111a and 111b, the second LED chip 112 includes two electrodes 112a and 112b, and the third LED chip 113 includes two electrodes 113a and 113b. In some embodiments, the LED chips are micro LED chips.

In some embodiments, the flexible redistribution layer 109 includes a thin insulating layer 110 and a plurality of conductive structures 116, each conductive structure 116 passes through the thin insulating layer 110 from the back side 110B of the thin insulating layer 110 to be electrically connected to the corresponding electrode of the first LED chip 111, the second LED chip 112, and the third LED chip 113. Moreover, in some embodiments, the thickness of the thin insulating layer 110 ranges from about 10 to 50 μm.

As shown in FIG. 2, in some embodiments, the first light-adjusting layer 121, the second light-adjusting layer 122, and the third light-adjusting layer 123 respectively disposed on the first LED chip 111, the second LED chip 112, and the third LED chip 113. The first light-adjusting layer 121 includes a first light extraction layer 120a and a first color conversion composite layer 131, wherein the first color conversion composite layer 131 includes a first wavelength conversion layer 131a and a first filter layer 131b. The second light-adjusting layer 122 includes a second light extraction layer 120b and a second color conversion composite layer 132, wherein the second color conversion composite layer 132 includes a second wavelength conversion layer 132a and a second filter layer 132b. The third light-adjusting layer 123 includes a third light extraction layer 120c and a transparent light extraction layer 133.

In more detail, the first light extraction layer 120a is disposed on the first LED chip 111, the first wavelength conversion layer 131a is disposed on the first light extraction layer 120a, and the first filter layer 131b is disposed on the first wavelength conversion layer 131a; the second light extraction layer 120b is disposed on the second LED chip 112, the second wavelength conversion layer 132a is disposed on the second light extraction layer 120b, and the second filter layer 132b is disposed on the second wavelength conversion layer 132a; and the third light extraction layer 120c is disposed on the third LED chip 113, and the transparent light extraction layer 133 is disposed on the third light extraction layer 120c. The first light extraction layer 120a, the second light extraction layer 120b, and the third light extraction layer 120c may be transparent layers and the same material, and the transparent light extraction layer 133 may include the same or similar material as the third light extraction layer 120c.

Moreover, the first light extraction layer 120a may cover the top surface of the first LED chip 111, cover the top surface and four side surfaces of the first LED chip 111, or cover the top surface and four side surfaces of the first LED chip 111 and a portion of the bottom surface of the first LED chip 111 except the electrodes 111a and 111b. The second light extraction layer 120b may cover the top surface of the second LED chip 112, cover the top surface and four side surfaces of the second LED chip 112, or cover the top surface and four side surfaces of the second LED chip 112 and a portion of the bottom surface of the second LED chip 112 except the electrodes 112a and 112b. The third light extraction layer 120c may cover the top surface of the third LED chip 113, cover the top surface and four side surfaces of the third LED chip 113, or cover the top surface and four side surfaces of the third LED chip 113 and a portion of the bottom surface of the third LED chip 113 except the electrodes 113a and 113b.

In some embodiments, the first wavelength conversion layer 131a and the second wavelength conversion 132a each includes fluorescent powders, quantum dot materials, or a combination thereof. For example, the first wavelength conversion layer 131a may include red fluorescent powders, red quantum dot materials, or a combination thereof, and the second wavelength conversion layer 132a may include green fluorescent powders, red quantum dot materials, or a combination thereof, but the present disclosure is not limited thereto. Therefore, in some embodiments, the first wavelength conversion layer 131a absorbs part of the first light emitted from the first LED chip 111 (e.g., blue light or ultraviolet light) and converts the first light into red light, and the second wavelength conversion layer 132a absorbs part of the second light emitted from the second LED chip 112 (e.g., blue light or ultraviolet light) and converts the second light into green light. The third light emitted from the third LED chip 113 may be blue light, and the blue light is emitted through the transparent light extraction layer 133. Accordingly, the pixel package PP may be an RGB pixel package.

In other embodiments of the pixel structure, on the third light extraction layer 120c corresponding to the third LED chip 113, a third color conversion composite layer (not shown) is used to replace the transparent light extraction layer 133 in FIG. 2. The third color conversion composite layer includes a third wavelength conversion layer (not shown) on the third light extraction layer 120c and a third filter layer (not shown) on the third wavelength conversion layer. Similarly, the third wavelength conversion includes fluorescent powders, quantum dot materials or a combination thereof. For example, the third wavelength conversion may include blue fluorescent powders, blue quantum dot materials, or a combination thereof, but the present disclosure is not limited thereto. The third wavelength conversion layer absorbs part of the third light emitted from the third LED chip 113 (e.g., ultraviolet light) and converts the third light into blue light.

Moreover, the first filter layer 131b and the second filter layer 132b may, for example, filter out blue light, UV light, or light having a wavelength less than about 450 nm, so that the color of the light converted by the first wavelength conversion layer 131a or the second wavelength conversion layer 132a is made closer to the color of the fluorescent powders, quantum dot materials, or a combination thereof included in the first wavelength conversion layer 131a or the second wavelength conversion layer 132a, but the present disclosure is not limited thereto. In some other embodiments, the first filter layer 131b and the second filter layer 132b may not be provided.

In some embodiments, the pixel package PP is an active pixel package. As shown in FIG. 1 and FIG. 2, the pixel package PP further includes a control chip 114 disposed on the surface of the flexible redistribution layer 109 and covered by one of the flexible composite laminates 103. The control chip 114 may be used to control the first LED chip 111, the second LED chip 112, and the third LED chip 113. As shown in FIG. 2, the control chip 114 may have two electrodes 114a and 114b, but the number of electrodes is not limited thereto. The electrodes 114a and 114b are electrically connected to the conductive structure 116 of the flexible redistribution layer 109.

The control chip 114 is, for example, a control chip (e.g., a diode, a transistor, an integrated circuit) 114 that can control the execution of predetermined electronic functions or a control chip 114 (e.g., light-emitting diodes, laser diodes, photodiodes) with photonic functions. Alternatively, the control chip 114 may also be a microchip made of silicon or semiconductor-on-insulator (SOI) wafer and used for logic or memory applications, or a microchip made of gallium arsenide (GaAs) wafer and used for RF communication applications, but the present disclosure is not limited thereto.

To make the overall size of the pixel package PP smaller or thinner, in some embodiments, the control chip 114 is a micro control chip. The control chip 114 is covered by the flexible composite laminates 103 in the pixel package PP, wherein the flexible reflection layer 104 covers the control chip 114, and the flexible light-shielding layer 106 is located on the flexible reflection layer 104. In some embodiments, the flexible reflection layer 104 covers the top surface of the control chip 114, the flexible reflection layer 104 covers the top surface and the four side surfaces of the control chip 114, or the flexible reflection layer 104 covers the top surface, four side surfaces, and a portion of the bottom surface of the control chip 114 except the electrodes 114a and 114b.

Moreover, as shown in FIG. 1, the first LED chip 111 (only the first filter layer 131b is shown in FIG. 1), the second LED chip 112 (only the second filter layer 132b is shown in FIG. 1), the third LED chip 113, and the control chip 114 may form a 2×2 array, but the present disclosure is not limited thereto. In some other embodiments, the first LED chip 111, the second LED chip 112, the third LED chip 113, and the control chip 114 are arranged in the same direction (i.e., may form an 1×4 array).

As shown in FIG. 2, in some embodiments, the flexible composite laminate 103 includes a flexible reflection layer 104 disposed on the flexible redistribution layer 109 and a flexible light-shielding layer 106 disposed on the flexible reflection layer 104. The flexible reflection layer 104 may be used to reflect light to improve luminous efficiency, and the flexible light-shielding layer 106 may be used to increase the contrast. The flexible reflection layer 104 may be a flexible white reflection layer with flexibility. The flexible light-shielding layer 106 may be a flexible black light-absorbing layer with flexibility. The top surface of the flexible reflection layer 104 is higher than the top surface of the first wavelength conversion layer 131a and the top surface of the second wavelength conversion layer 132a, and the top surface 106T of the flexible light-shielding layer 106, the top surface 131bT of the first filter layer 131b, and the top surface 132bT of the second filter layer 132b are coplanar.

As shown in FIG. 2, in some embodiments, the flexible reflection layer 104 surrounds at least two-thirds of the thickness of the first filter layer 131b and the thickness of the second filter layer 132b, and the thickness of the first filter layer 131b is calculated from the bottom surface of the first filter layer 131b and the thickness of the second filter layer 132b is calculated from the bottom surface of the second filter layer 132b. The ratio of the thickness of the flexible light-shielding layer 106 to the thickness of the first filter layer 131b or the thickness of the second filter layer 132b is equal to or smaller than about ⅓. It can be seen from this that the flexible reflection layer 104 covers the side surfaces of the first light extraction layer 120a, the second light extraction layer 120b and the third light extraction layer 120c, covers the side surfaces of the first wavelength conversion layer 131a and the second wavelength conversion layer 132a, and covers portions of the side surfaces of the first filter layer 131b and the second filter layer 132b.

The flexible composite laminates 103 may effectively improve the luminous efficiency of the pixel package PP and enhance the color contrast. Taking the region where the first LED chip 111 is located and the first wavelength conversion layer 131a is a red wavelength conversion layer as an example, after the blue light or ultraviolet light emitted by the first LED chip 111 is emitted through the first light extraction layer 120a, the lateral blue light or ultraviolet light may be reflected by the lateral flexible reflection layer 104, for example, to the first wavelength conversion layer 131a and converted into red light. If the lateral blue light or ultraviolet light is reflected to the first filter layer 131b, it may be filtered out. The first wavelength conversion layer 131a absorbs part of the blue light or ultraviolet light and converts it into red light, and the lateral red light may be reflected by the lateral flexible reflection layer 104. The first filter layer 131b is used for filtering the unconverted blue light or ultraviolet light, so that the red light is emitted through the top surface 131bT of the first filter layer 131b, and the lateral red light may be reflected by the lateral flexible reflection layer 104 to the first filter layer 131b to be filtered and then emitted.

It can be seen from this that the pixel package PP of the present disclosure is a flexible pixel package, and the entire pixel package PP may be easily bent due to the flexible redistribution layer 109 and the flexible composite laminates 103. In some embodiments, when the LED chips (e.g., the first LED chip 111, the second LED chip 112, and the third LED chip 113) are micro LED chips, a pixel package PP with small size and easily bent may be realized.

FIGS. 3-5 and FIGS. 7-15 are partial cross-sectional views illustrating various stages of forming the pixel package PP according to some embodiments of the present disclosure. It should be noted that some components of the pixel package PP have been omitted in FIGS. 3-5 and FIGS. 7-15 for sake of brevity.

Figure 3:
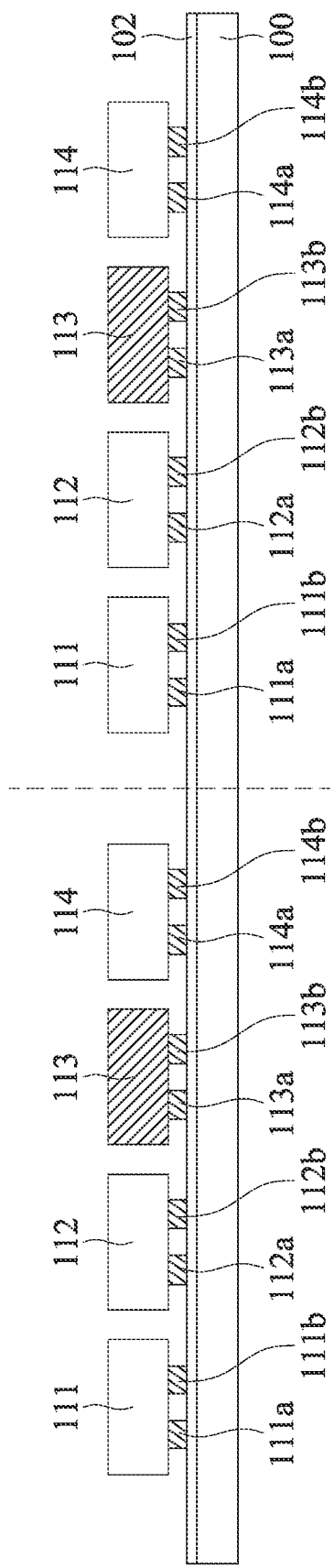
FIGS. 3-5 are partial cross-sectional views illustrating various stages of forming the pixel package according to some embodiments of the present disclosure.

Referring to FIG. 3, in some embodiments, a first temporary substrate 100 is provided. For example, the first temporary substrate 100 is, for example, a carrier substrate, which may include a plastic substrate, a glass substrate, a sapphire substrate, or any other substrate without circuits, but the present disclosure is not limited thereto.

Then, in some embodiments, multiple flip-chip LED chips are transferred to the first temporary substrate 100. For example, the LED chips may be micro LED chips, and are transferred to the first temporary substrate 100 by a mass transfer technique. The mass transfer technique may, for example, use a pick-up device that may pick up a plurality of micro LED chips at one time and place the micro LED chips on the first temporary substrate 100. In some embodiments, the pick-up device includes a viscous and patterned transfer head for picking up micro LED chips. The pick-up device includes, for example, a transfer head of polydimethylsiloxane (PDMS) with a plurality of protruding structures. After the micro LED chips are attached by the protruding structures of the transfer head, the micro LED chips are transferred to the first temporary substrate 100, but the present disclosure is not limited thereto.

In some embodiments, the flip-chip LED chips includes a first LED chip 111, a second LED chip 112, and a third LED chip 113 respectively emit a first light, a second light, and a third light. For example, the first light, the second light, and the third light may be blue light or ultraviolet light. In some embodiments, the first LED chip 111 and the second LED chip 112 emit ultraviolet light, and the third LED chip emits blue light. In some other embodiments, the first LED chip 111, the second LED chip 112, and the third LED chip 113 all emit blue light. Moreover, the first LED chip 111, the second LED chip 112, and the third LED chip 113 are, for example, small-sized micro LED chips.

The micro LED chip may include an N-type semiconductor layer, a light-emitting layer, and a P-type semiconductor layer, and the light-emitting layer is disposed between the N-type semiconductor layer and the P-type semiconductor layer. The light emitted by the micro LED chip is determined by the light-emitting layer. For example, the light-emitting layers of the first LED chip 111 and the second LED chips 112 may emit ultraviolet light, and the light-emitting layer of the third LED chips 113 may emit blue light, but the present disclosure is not limited thereto. Alternately, the light-emitting layers of the first LED chip 111, the second LED chips 112, and the third LED chip 113 may all emit blue light, but the present disclosure is not limited thereto.

The N-type semiconductor layer may include a group II-VI material (e.g., zinc selenide (ZnSe)) or a group III-V material (e.g., gallium nitride (GaN), aluminum nitride (AlN), indium nitride (InN), indium gallium nitride (InGaN), aluminum gallium nitride (AlGaN), or aluminum indium gallium nitride (AlInGaN)), and the N-type semiconductor layer may include dopants such as silicon (Si) or germanium (Ge), but the present disclosure is not limited thereto.

The light-emitting layer may include at least one undoped semiconductor layer or at least one low-doped semiconductor layer. For example, the light-emitting layer may be a quantum well (QW) layer, which may include indium gallium nitride ($In_xGa_{1-x}N$) or gallium nitride (GaN), but the present disclosure is not limited thereto. Alternately, the light-emitting layer may be a multiple quantum well (MQW) layer.

The P-type semiconductor layer may include a group II-VI material (e.g., zinc selenide (ZnSe)) or a group III-V material (e.g., gallium nitride (GaN), aluminum nitride (AlN), indium nitride (InN), indium gallium nitride (InGaN), aluminum gallium nitride (AlGaN), or aluminum indium gallium nitride (AlInGaN)), and the P-type semiconductor layer may include dopants such as magnesium (Mg) or carbon (C), but the present disclosure is not limited thereto. Moreover, the N-type semiconductor layer may be a single-layer or multi-layer structure, and the P-type semiconductor layer may be a single-layer or multi-layer structure.

As shown in FIG. 3, the first LED chip has two electrodes 111a and 111b, one of which is electrically connected to the P-type semiconductor layer of the first LED chip 111 as a positive electrode, and the other is electrically connected to the N-type semiconductor layer of the first LED chip 111 as a negative electrode. The second LED chip has two electrodes 112a and 112b, one of which is electrically connected to the P-type semiconductor layer of the second LED chip 112 as a positive electrode, and the other is electrically connected to the N-type semiconductor layer of the second LED chip 112 as a negative electrode. The third LED chip has two electrodes 113a and 113b, one of which is electrically connected to the P-type semiconductor layer of the third LED chip 113 as a positive electrode, and the other is electrically connected to the N-type semiconductor layer of the third LED chip 113 as a negative electrode.

The electrode 111a, the electrode 111b, the electrode 112a, the electrode 112b, the electrode 113a, and the electrode 113b include conductive materials, such as metal, metal silicide, similar materials, or a combination thereof, but the present disclosure is not limited thereto. For example, the metal may include gold (Au), nickel (Ni), platinum (Pt), palladium (Pd), iridium (Ir), titanium (Ti), chromium (Cr), tungsten (W), aluminum (Al), copper (Cu), similar materials, an alloy thereof, or a combination thereof, but the present disclosure is not limited thereto.

Moreover, as shown in FIG. 3, a debonding layer 102 may be formed on the first temporary substrate 100 and between the first temporary substrate 100 and the first LED chip 111 (or the second LED chip 112 or the third LED chip 113). The debonding layer 102 may include an epitaxial material (e.g., gallium nitride (GaN)) or a high molecular polymer having light-absorbing groups. Taking polymers as an example, under the corresponding wavelength (e.g., 100 nm to 400 nm) and energy, the segment of the light-absorbing group in the polymer may be photo-cleaved into small molecular fragments to release the attached components, but the present disclosure is not limited thereto.

Referring to FIG. 3, in some embodiments, multiple control chips 104 are transferred to the first temporary substrate 100 while the LED chips (e.g., the first LED chip 111, the second LED chip 112, or the third LED chip 113) are transferred to the first temporary substrate 100. As shown in FIG. 3, the control chip 104 may have two electrodes 114a and 114b, but the present disclosure is not limited thereto. Similarly, the mass transfer technique may be used to transfer the control chips 104 to the first temporary substrate 100.

Figure 4:
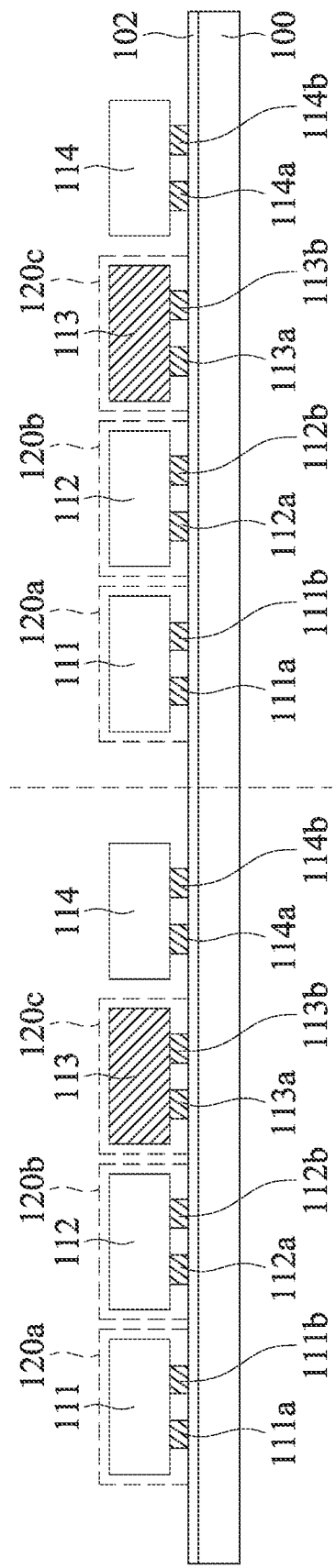

Referring to FIG. 4, in some embodiments, a first light extraction layer 120a, a second light extraction layer 120b, and a third light extraction layer 120c are respectively formed on the first LED chip 111, the second LED chip 112, and the third LED chip 113. For example, the first light extraction layer 120a, the second light extraction layer 120b, and the third light extraction layer 120c may include transparent layers, and the material thereof may include silicon glue and epoxy resin, but the present disclosure is not limited thereto. In some embodiments, the first light extraction layer 120a, the second light extraction layer 120b, and the third light extraction layer 120c are conformally formed on the top surfaces and the side surfaces of the first LED chip 111, the second LED chip 112, and the third LED chip 113, respectively. For example, the first light extraction layer 120a may be coated on and cover (five) surfaces of the first LED chip 111 except the bottom surface of the first LED chip 111 by a spin-on coating, the second light extraction layer 120a may be coated on and cover (five) surfaces of the second LED chip 112 except the bottom surface of the second LED chip 112 by a spin-on coating, and the third light extraction layer 120a may be coated on and cover (five) surfaces of the third LED chip 113 except the bottom surface of the third LED chip 113 by a spin-on coating, but the present disclosure is not limited thereto.

Figure 5:
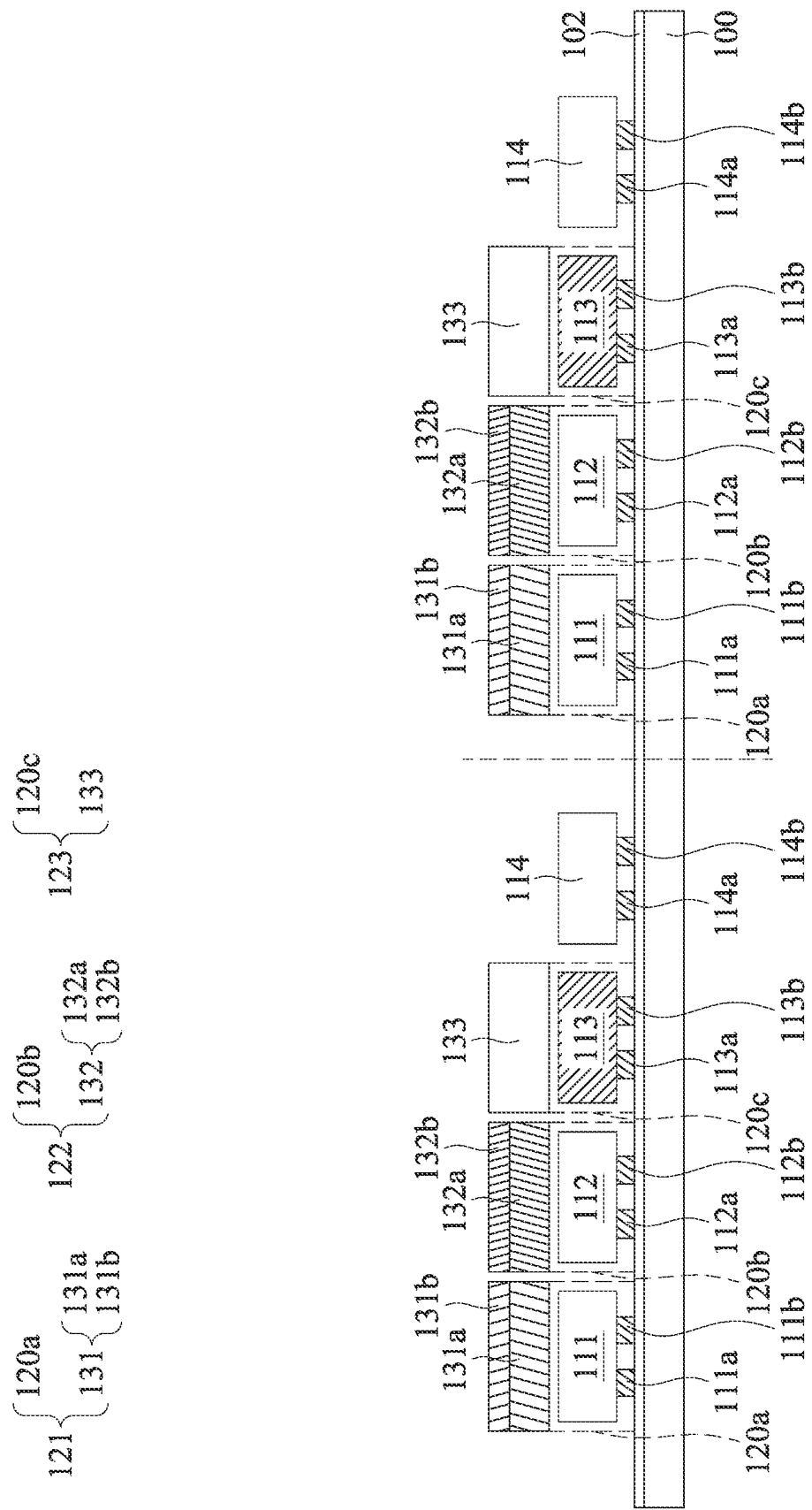

Referring to FIG. 5, in some embodiments, a first color conversion composite layer 131 is transferred to the first light extraction layer 120a that corresponds to the first LED chip 111, and a second color conversion composite layer 132 is transferred to the second light extraction layer 120b that corresponds to the second LED chip 112, wherein the first color conversion composite layer 131 includes a first wavelength conversion layer 131a and a first filter layer 131b, and the second color conversion composite layer 132 includes a second wavelength conversion layer 132a and a second filter layer 132b. Specifically, the first wavelength conversion layer 131a is on the first light extraction layer 120a that corresponds to the first LED chip 111 (e.g., capable of emitting ultraviolet light), and the first filter layer 131b is on the first wavelength conversion layer 131a; the second wavelength conversion layer 132a is on the second light extraction layer 120b that corresponds to the second LED chip 112 (e.g., capable of emitting ultraviolet light), and the second filter layer 132b is on the second wavelength conversion layer 132a.

Figure 6A:
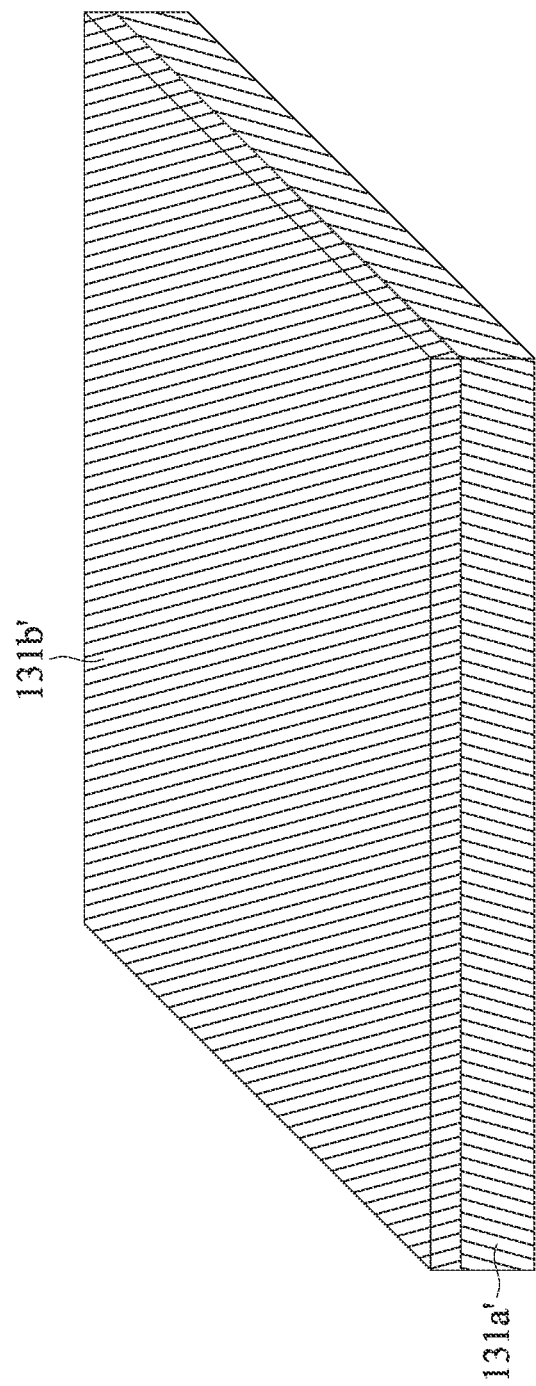
FIGS. 6A-6E are schematic diagrams illustrating various stages of forming and transferring the first color conversion composite layer according to some embodiments of the present disclosure.
Figure 6B:
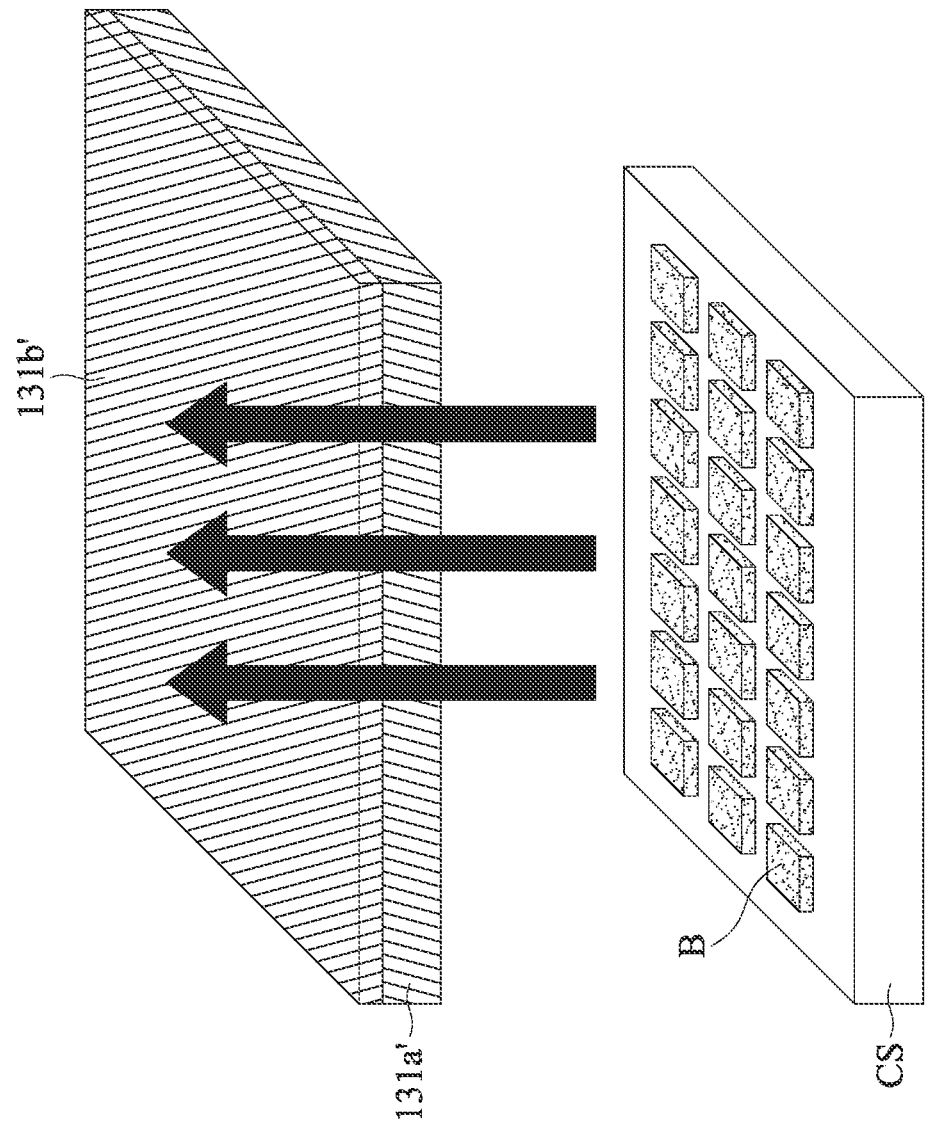
Figure 6C:
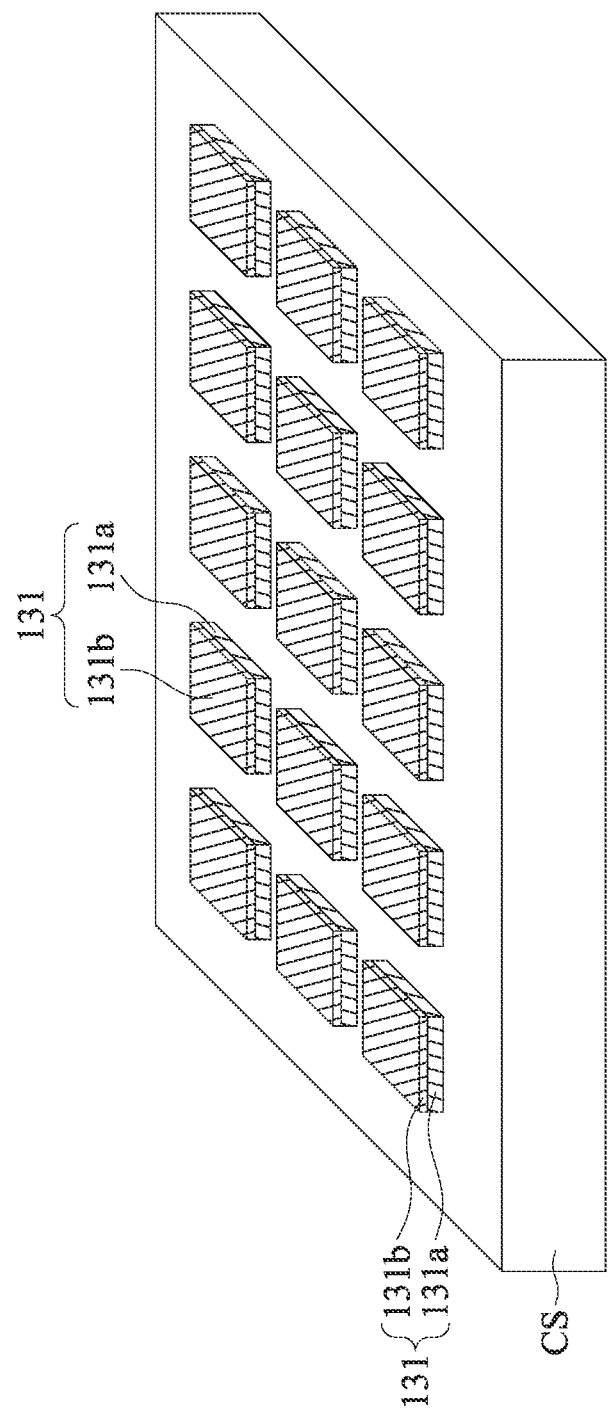
Figure 6D:
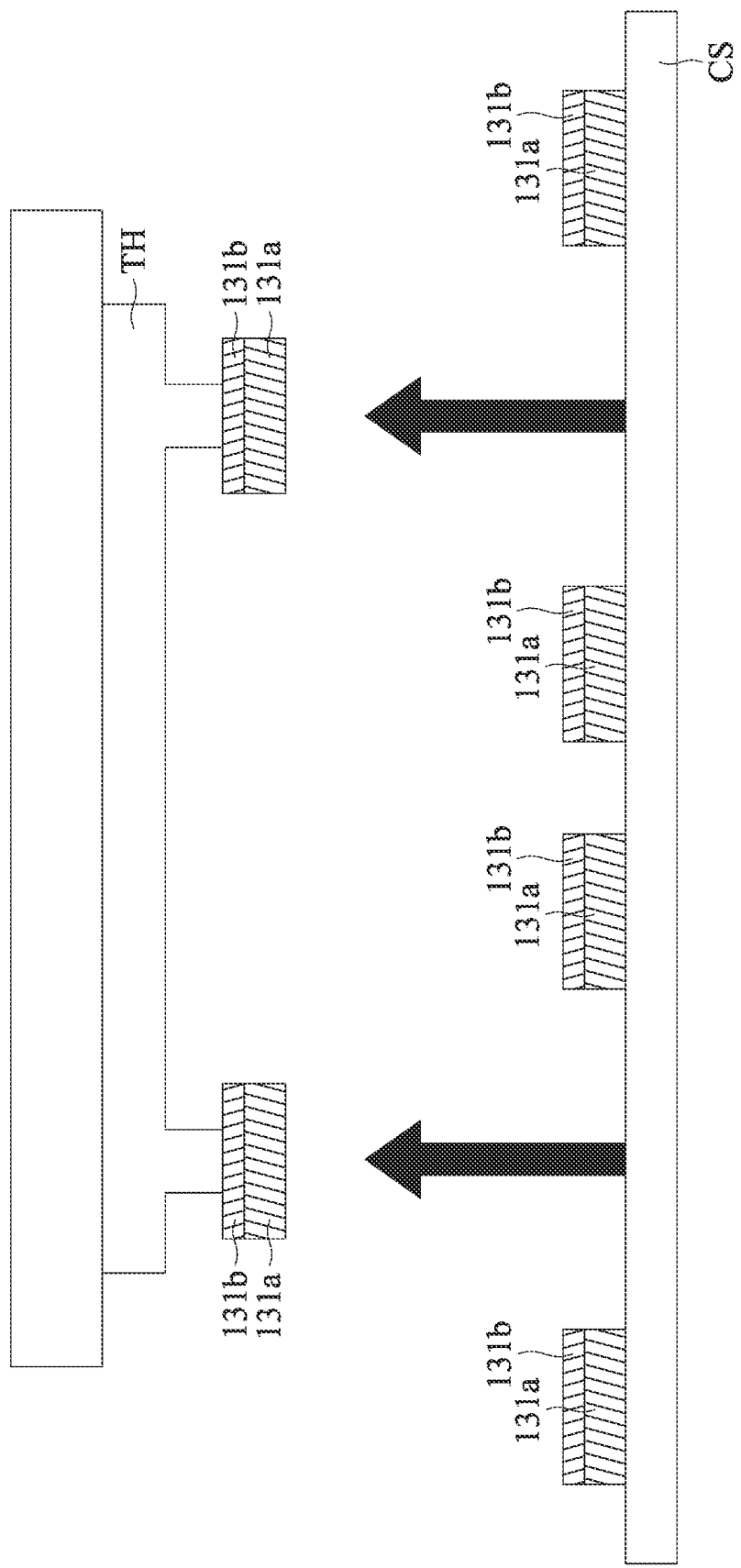
Figure 6E:
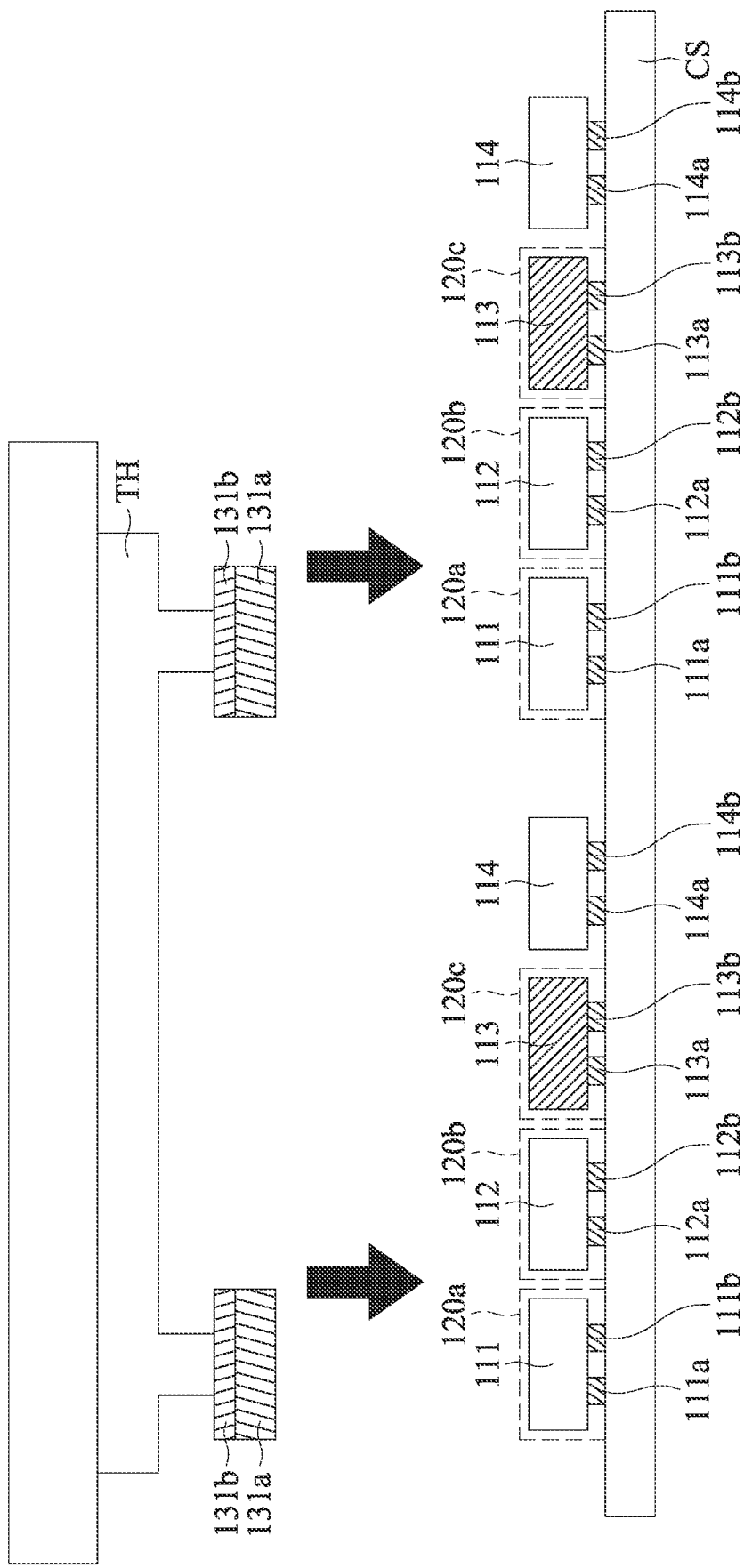

FIGS. 6A-6E are schematic diagrams illustrating various stages of forming and transferring the first color conversion composite layer 131 according to some embodiments of the present disclosure. In order to show the features of these steps more clearly, FIGS. 6A-6C are three-dimensional views, and FIGS. 6D-6E are cross-sectional views. It should be noted that some components have been omitted in FIGS. 6A-6E for sake of brevity.

Referring to FIG. 6A, in some embodiments, a filter layer 131b' is formed on the red quantum dot (QD) film 131a'. Then, referring to FIG. 6B, the red quantum dot film 131a' and the filter layer 131b' are tested and sorted, and multiple bins are measured and collected by a plurality of backlight spots B on the carrier substrate CS. Then, referring to FIG. 6B and FIG. 6C, according to the plurality of backlight spots B, the red quantum dot film 131a' and the filter layer 131b' are cut into multiple first color conversion composite layers 131 by, for example, a laser. Then, referring to FIG. 6D, the first color conversion composite layers 131 are picked up by the transfer head TH. Finally, referring to FIG. 6E, the first color conversion composite layers 131 are transferred to the first temporary substrate 100 and correspond to the first light extraction layer 120a of the first LED chip 111.

The second color conversion composite layer 132 may be transferred to the first temporary substrate 100 in a manner similar to that shown in FIGS. 6A-6E, and correspond to the second light extraction layer 120b of the second LED 112, which will not be repeated here.

As shown in FIG. 5, in some embodiments, a transparent light extraction layer 133 is formed on the third light extraction layer 120c that corresponds to the third LED chip 113 (capable of emitting blue light). The transparent light extraction layer 133 may include the same or similar materials as the third light extraction layer 120c (or the first light extraction layer 120a or the second light extraction layer 120b), but the present disclosure is not limited thereto. In some other embodiments, a third color conversion composite layer that includes a third wavelength conversion layer (not shown) and a third filter layer (not shown) is transferred onto the third light extraction layer 120c. The third wavelength conversion layer is on the third light extraction layer 120c that corresponds to the third LED chip 113 (which is capable of emitting blue light, ultraviolet light, or other color light), and the third filter layer is on the third wavelength conversion layer.

In this embodiments, the first light extraction layer 120a and the first color conversion composite layer 131 (which includes the first wavelength conversion layer 131a and the first filter layer 131b) may be regarded as the first light-adjusting layer 121, the second light extraction layer 120b and the second color conversion composite layer 132 (which includes the second wavelength conversion layer 132a and the second filter layer 132b) may be regarded as the second light-adjusting layer 122, and the third light extraction layer 120c and the transparent light extraction layer 133 (or the third color conversion composite layer) may be regarded as the third light-adjusting layer 123.

That is, as shown in FIG. 5, in some embodiments, the first light-adjusting layer 121, the second light-adjusting layer 122, and the third light-adjusting layer 123 are respectively formed on the first LED chip 111, the second LED chip 112, and the third LED chip 113. The first light-adjusting layer 121 may be used to adjust the first light emitted by the first LED chip 111, the second light-adjusting layer 122 may be used to adjust the second light emitted by the second LED chip 112, and the third light-adjusting layer 123 may be used to adjust the third light emitted by the third LED chip 113.

Figure 7:
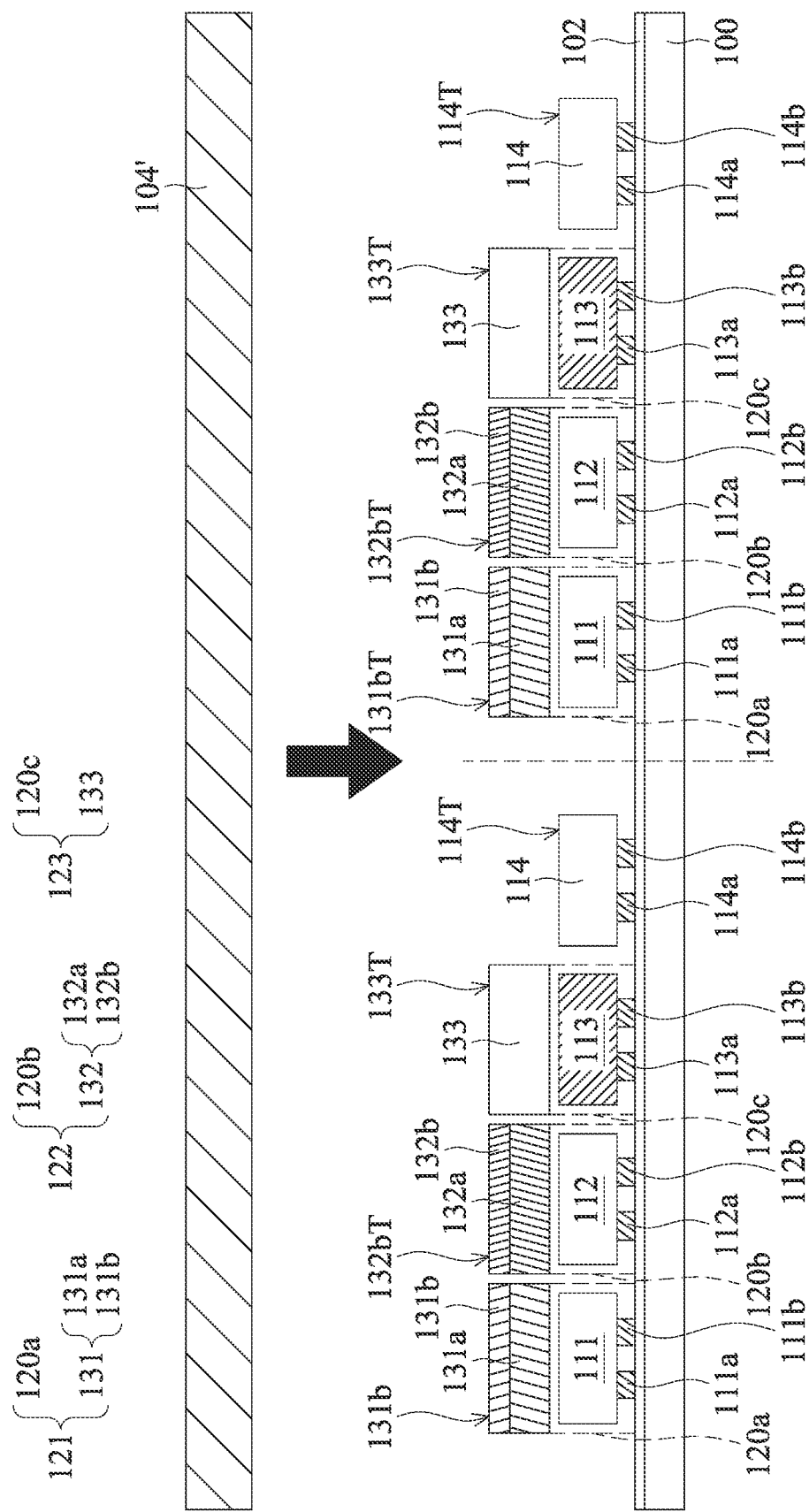
FIGS. 7-15 are partial cross-sectional views illustrating various stages of forming the pixel package according to some embodiments of the present disclosure.

Referring to FIG. 7, in some embodiments, a semi-cured reflective film 104' is provided. In some embodiments, the semi-cured reflective film 104' includes a reflective material and a b-stage adhesive material (e.g., a thermosetting resin). The reflective material includes, for example, titanium dioxide ($TiO_2$) or silicon oxide ($SiO_x$), but the present disclosure is not limited thereto. For example, the semi-cured reflective film 104' may be a white b-stage adhesive. Here, the b-stage adhesive is a two-stage thermosetting adhesive that requires a secondary bake to be fully cured. B-stage refers to the reaction between resin and curing agent to form a semi-cured solid, which may become fully cured after being heated and cured.

Figure 8:
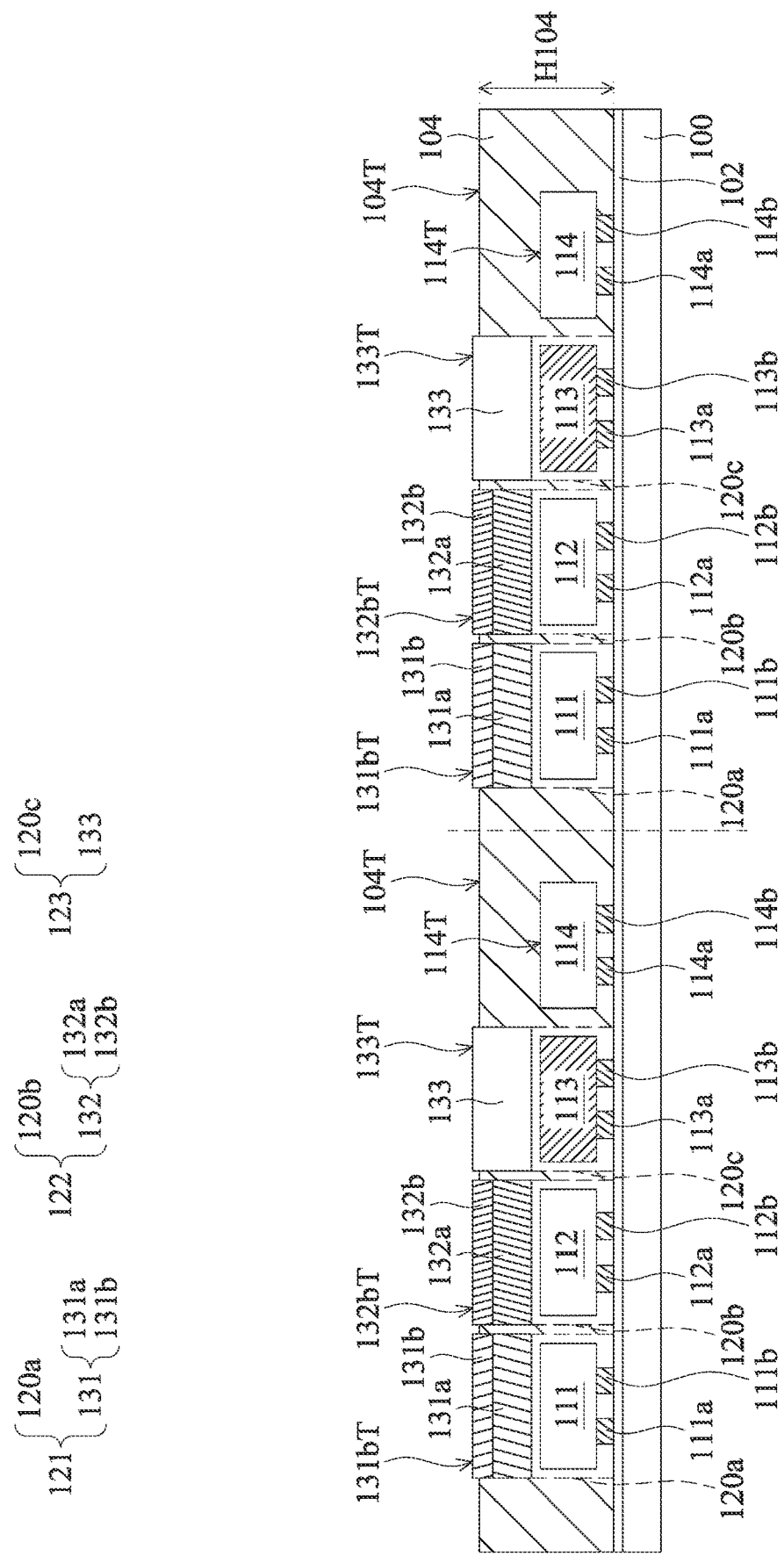

Referring to FIG. 7 and FIG. 8, in some embodiments, the semi-cured reflective film 104' is pressed down to be in direct contact with the top surface 131bT of the first filter layer 131b, the top surface 132bT of the second filter layer 132b, the top surface 133T of the transparent light extraction layer 133, and the top surface 114T of the control chip 114, so that the semi-cured reflective film 104' split-flows on the first temporary substrate 100 and covers the side surface of the first light extraction layer 120a, the side surface of the second light extraction layer 120b, the side surface of the third light extraction layer 120c, the side surface of the first wavelength conversion layer 131a, the side surface of the second wavelength conversion layer 132a, a portion of the side surface of the first filter layer 131b, a portion of the side surface of the second filter layer 132b, a portion of the side surface of the transparent light extraction layer 133, and the top surface and the side surface of the control chip 114.

Then, as shown in FIG. 8, in some embodiments, the semi-cured reflective film 104' is cured (e.g., baked again) to form a flexible reflection layer 104 between the LED chips. Specifically, the flexible reflection layer 104 may be between the first LED chip 111 and the second LED chip 112, between the second LED chip 112 and the third LED chip 112, and cover the control chip 114.

Moreover, as shown in FIG. 8, in some embodiments, the top surface 104T of the flexible reflection layer 104 is higher than the top surface of the first wavelength conversion layer 131a and the top surface of the second wavelength conversion layer 131b, but lower than the top surface 131bT of the first filter layer 131b and the top surface 132bT of the second filter layer 132b. In some embodiments, the flexible reflection layer 104 surrounds at least two-thirds of the thickness of the first filter layer 131b and at least two-thirds of the thickness of the second filter layer 132b, and the thickness of the first filter layer 131b is calculated from the bottom surface of the first filter layer 131b and the thickness of the second filter layer 132b is calculated from the bottom surface of the second filter layer 132b. For example, the thickness H104 may be about 44-87 μm, but the present disclosure is not limited thereto.

Figure 9:
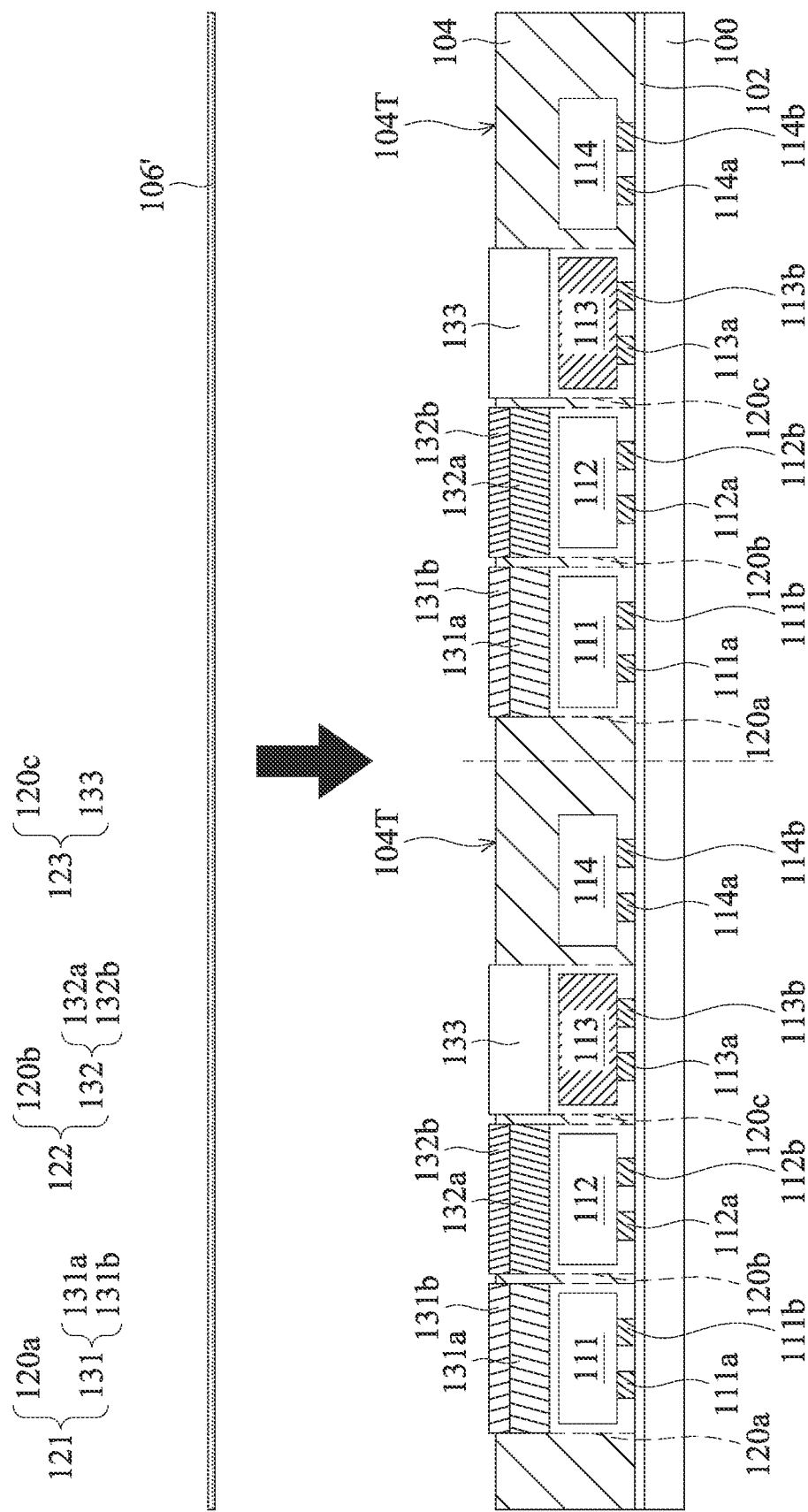

Referring to FIG. 9, in some embodiments, a semi-cured light-absorbing film 106' is provided. In some embodiments, the semi-cured light-absorbing film 106' includes a light-absorbing material and a semi-cured b-stage adhesive material (e.g., a thermosetting resin). The light-absorbing material includes, for example, carbon powders, but the present disclosure is not limited thereto. For example, the semi-cured light-absorbing film 106' may be a black and semi-cured b-stage adhesive. Examples of the b-stage adhesive material are described above and will not be repeated here.

Figure 10:
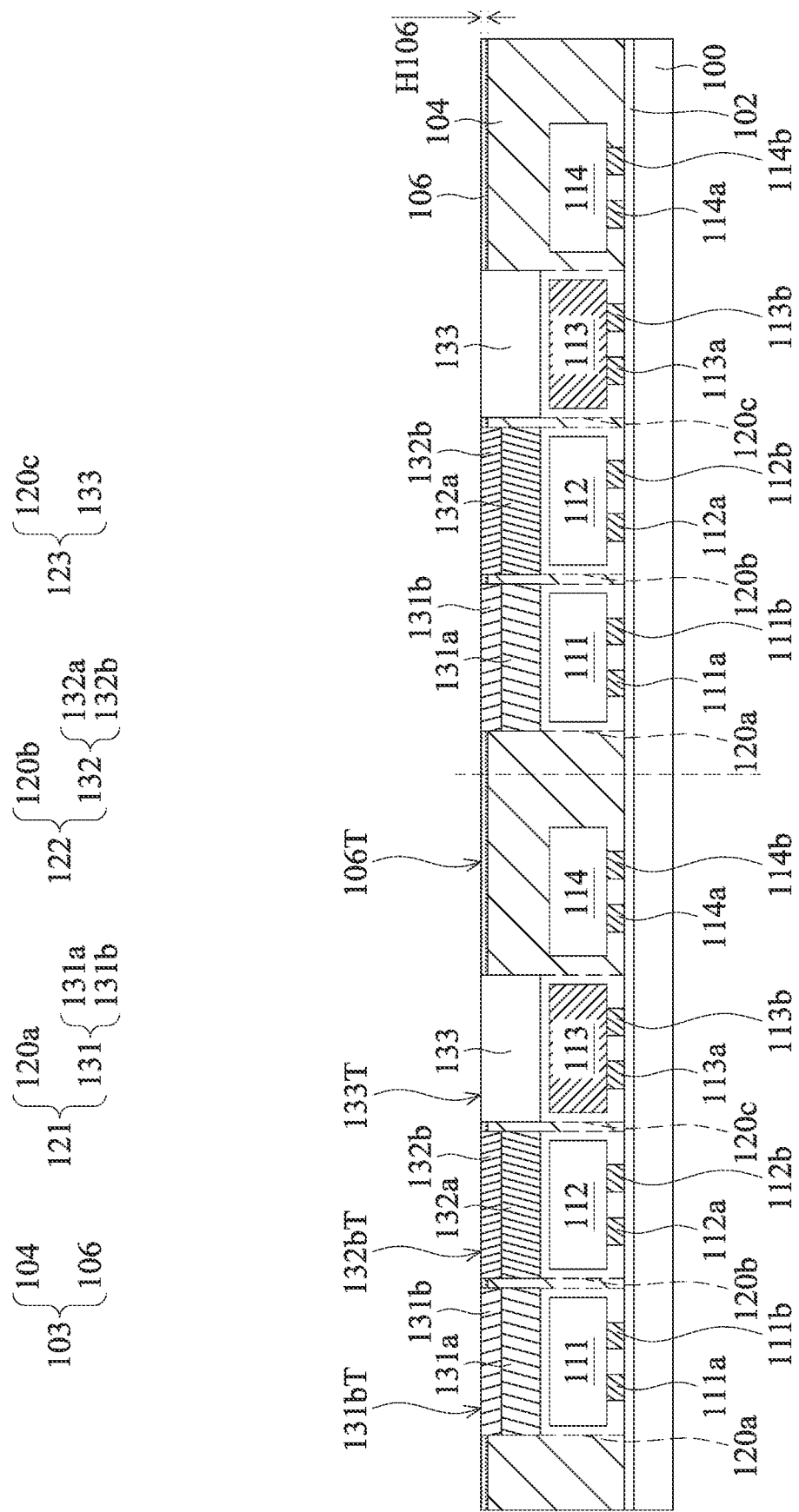

Referring to FIG. 9 and FIG. 10, in some embodiments, the semi-cured light-absorbing film 106' is pressed down to be in direct contact with the first filter layer 131b, the second filter layer 132b, and the transparent light extraction layer 133, so that the semi-cured light-absorbing film 106' split-flows on the top surface 104T of the flexible reflection layer 104 and covers the remaining exposed side surfaces of the first filter layer 131b, the second filter layer 132b, and the transparent light extraction layer 133.

Then, as shown in FIG. 10, in some embodiments, the semi-cured light-absorbing film 106' is cured to form a flexible light-shielding layer 106 on the flexible reflection layer 104. Specifically, the flexible light-shielding layer 106 may be between the first filter layer 131b and the second filter layer 132b, between the second filter layer 132b and the transparent light extraction layer 133, and disposed over the control chip 114.

Moreover, as shown in FIG. 10, in some embodiments, the top surface 106T of the flexible light-shielding layer 106, the top surface 131bT of the first filter layer 131b, and the top surface 132bT of the second filter layer 132b are substantially coplanar. In some embodiments, the ratio of the thickness of the flexible light-shielding layer 106 to the thickness of the first filter layer 131b or to the thickness of the second filter layer 132b is equal to or smaller than about ⅓. For example, the thickness H106 of the flexible light-shielding layer 106 may be about 3-6 μm, but the present disclosure is not limited thereto.

Here, the flexible reflection layer 104 and the flexible light-shielding layer 106 may be regarded as a flexible composite laminate 103. That is, as shown in FIG. 7 to FIG. 10, in some embodiments, multiple flexible composite laminates 103 are formed on the first temporary substrate 100, and the flexible composite laminates 103 are disposed between the first LED chip 111 and the second LED chip 112, and between the second LED chip 112 and the third LED chip 113. Moreover, in some embodiments, the control chip 114 is covered by some flexible composite laminates 103.

Figure 11:
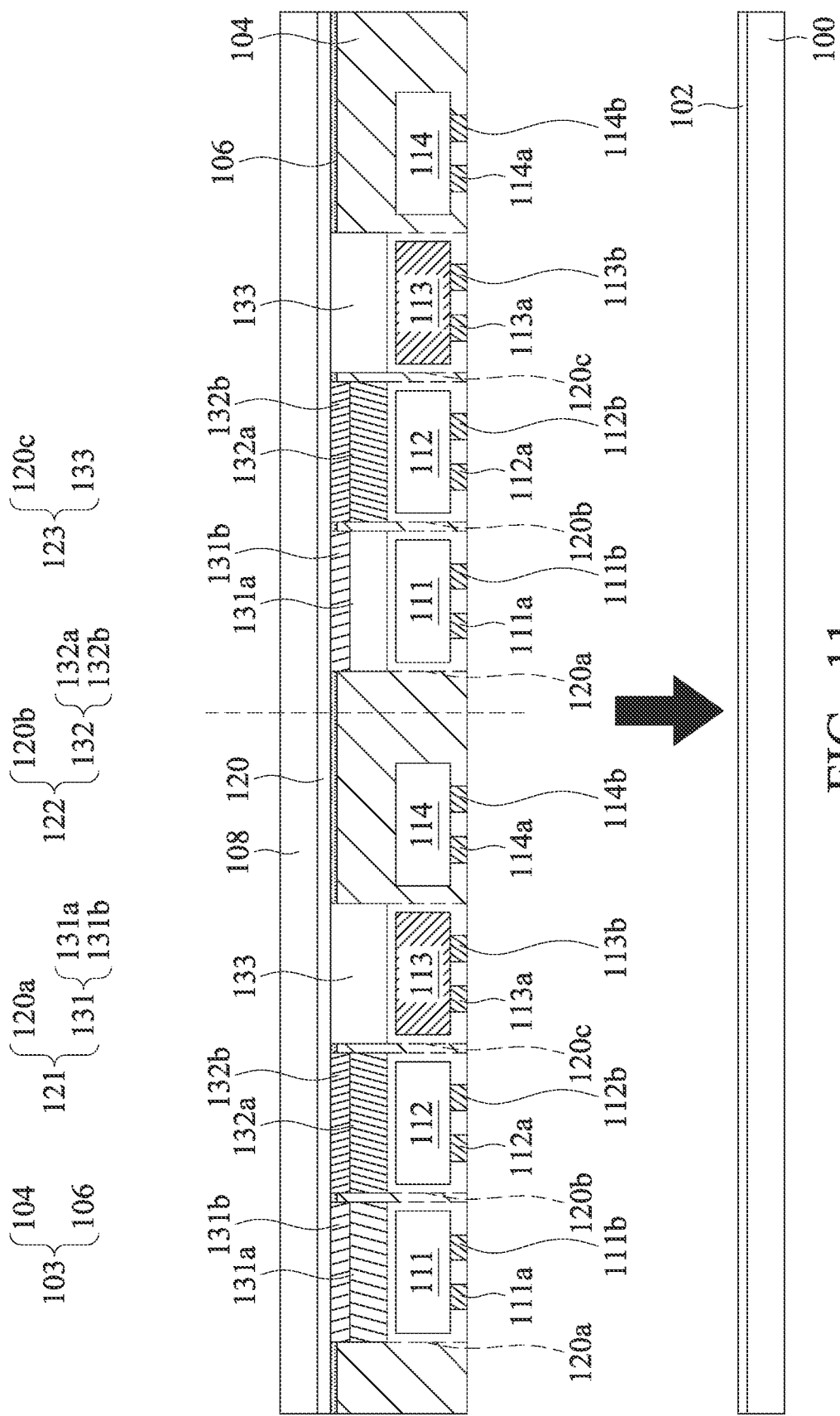

Referring to FIG. 11, in some embodiments, a second temporary substrate 108 is provided, and the second temporary substrate 108 is adhered to the top surfaces of the first light-adjusting layer 121, the second light-adjusting layer 122, the third light-adjusting layer 123, and the flexible composite laminates 103. The second temporary substrate 108 may have the same or similar material as the first temporary substrate 100, but the present disclosure is not limited thereto. Moreover, as shown in FIG. 11, a debonding layer 120 may be formed between the second temporary substrate 108 and the first light-adjusting layer 121 (or the second light-adjusting layer 122, the third light-adjusting layer 123, or the flexible composite laminates 103).

Then, as shown in FIG. 11, in some embodiments, the first temporary substrate 100 is removed from back sides of the first LED chip 111, the second LED chip 112, the third LED chip 113, (the control chip 114,) and the flexible composite laminates 103. For example, the first temporary substrate 100 may be released by irradiating the debonding layer 102 with light of a specific wavelength, but the present disclosure is not limited thereto.

Figure 12:
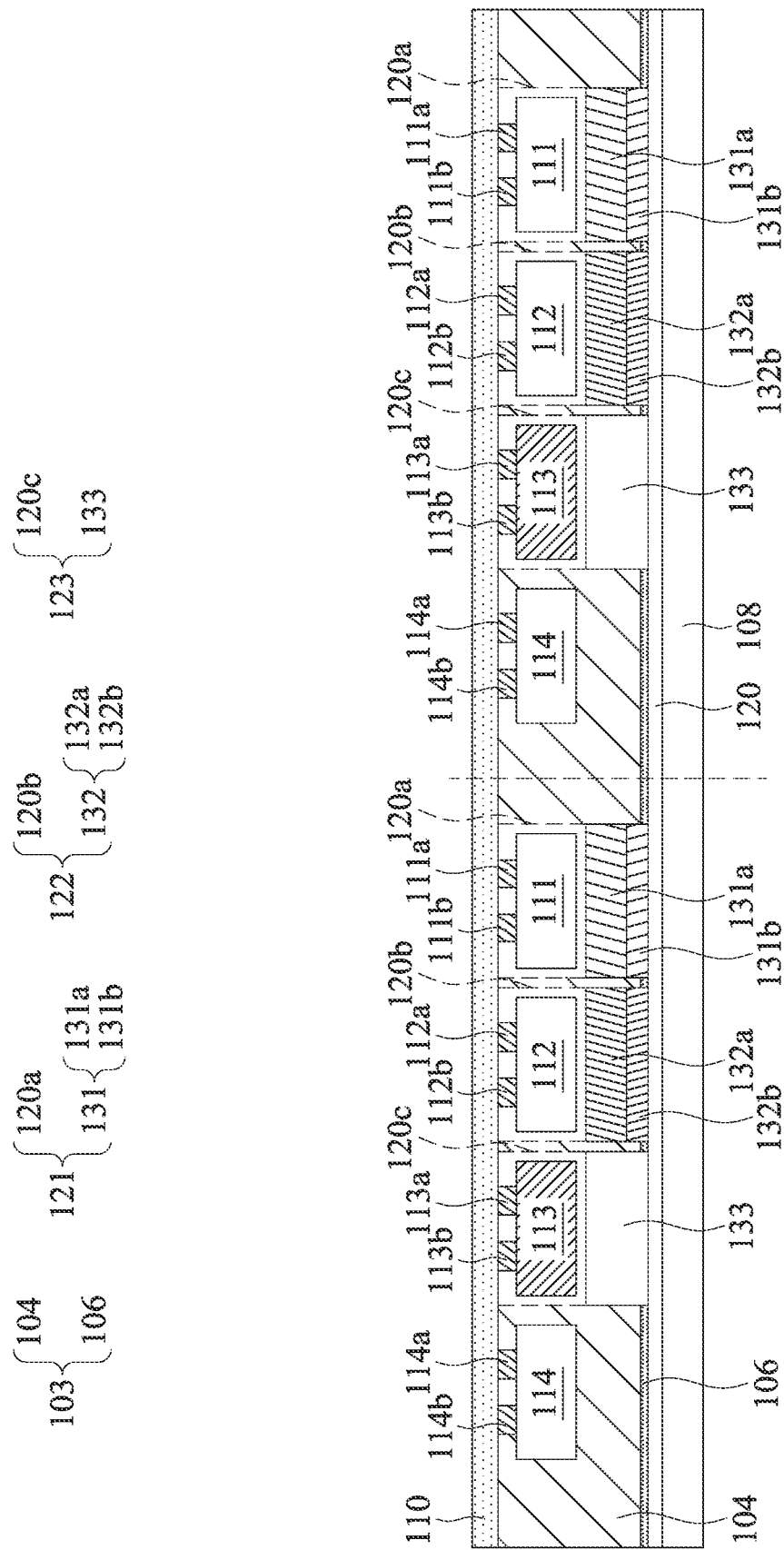

Referring to FIG. 12, in some embodiments, a thin insulating layer 110 is formed on the back sides of the first LED chip 111, the second LED chip 112, the third LED chip 113, (the control chip 114,) and the flexible composite laminates 103. For example, the thin insulating layer 110 may include insulating materials, such as oxides such as silicon oxide, nitrides such as silicon nitride, similar materials, or a combination thereof, but the present disclosure are not limited thereto. The insulating material may be deposited on the back sides of the first LED chip 111, the second LED chip 112, the third LED chip 113, (the control chip 114,) and the flexible composite laminates 103 by, for example, metal organic chemical vapor deposition, atomic layer deposition, molecular beam epitaxy, liquid phase epitaxy, similar processes, or a combination thereof, so as to form the thin insulating layer 110, but the present disclosure is not limited thereto.

Figure 13:
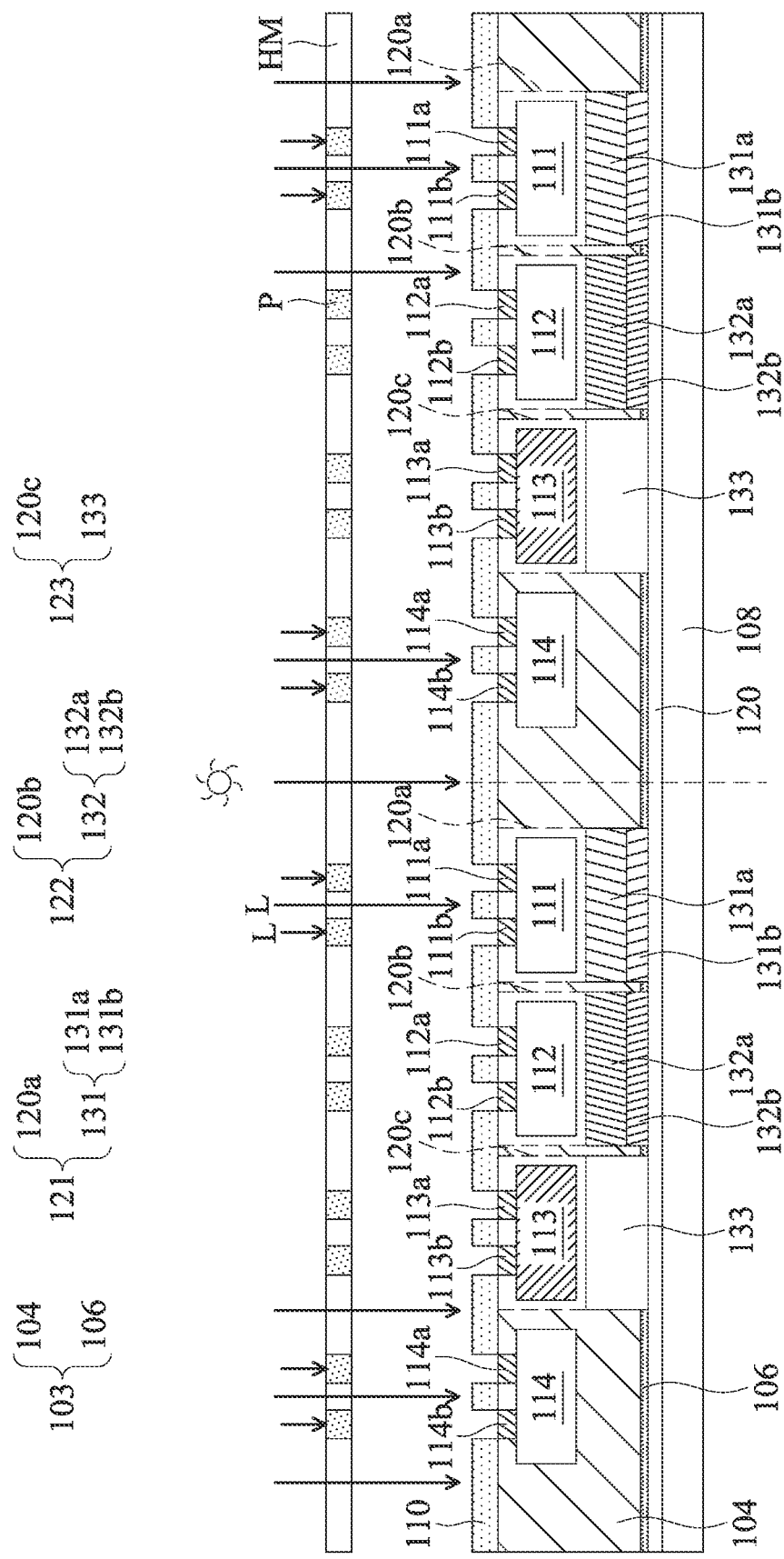

Referring to FIG. 13, in some embodiments, the thin insulating layer 110 is patterned to expose at least a portion of the electrodes 111a, 111b of the first LED chip 111, a portion of the electrodes 112a, 112b of the second LED chip 112, a portion of the electrodes 113a, 113b of the third LED chip 113, and a portion of the electrodes 114a, 114b of the control chip 114. In some embodiments, the thickness of the thin insulating layer 110 ranges from about 10 to 50 µm.

For example, a mask layer HM may be disposed on the thin insulating layer 110, and then an etching process is performed using the mask layer HM as an etching mask, so as to etch the thin insulating layer 110 to form a plurality of trenches. The mask layer HM may include a photoresist, such as a negative photoresist (or a positive photoresist in other examples). In addition, the mask layer HM may include a hard mask, and may be made of silicon oxide ($SiO_2$), silicon nitride (SiN), silicon oxynitride (SiON), silicon carbide (SiC), silicon carbide nitride (SiCN), the like, or a combination thereof. The mask layer HM may be a single-layer or multi-layer structure.

Figure 14:
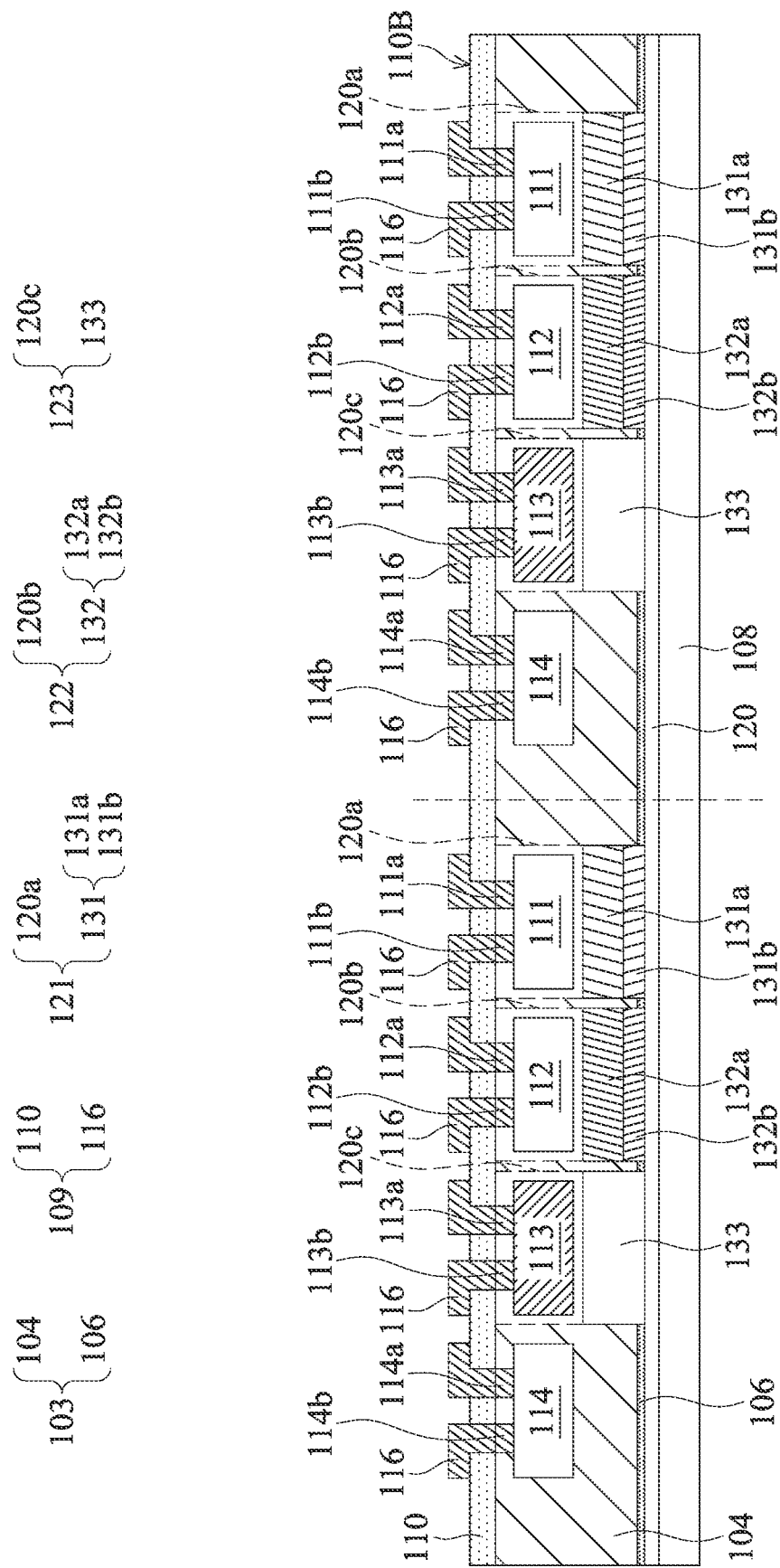

Referring to FIG. 14, in some embodiments, multiple conductive structures 116 are formed in the plurality of trenches of the patterned thin insulating layer 110. As shown in FIG. 14, in some embodiments, each conductive structure 16 passes through the thin insulating layer 110 from the back side 110B of the thin insulating layer 110 to be electrically connected to the corresponding electrode in the corresponding first LED chip 111, second LED chip 112, third LED chip 113, or control chip 114.

For example, the conductive structure 116 may pass through the thin insulating layer 110 from the back side 110B of the thin insulating layer 110 and be electrically connected to the electrodes 111a and 111b of the first LED chip 111, the electrodes 112a and 112b of the second LED chip 112, the electrodes 113a and 113b of the third LED chip 113, or the electrodes 114a and 114b of the control chip 114, but the present disclosure is not limited thereto. The conductive structure 116 may include metal. Examples of the metal are as described above and will not be repeated here, but the present disclosure is not limited thereto.

Here, the thin insulating layer 110 and the conductive structure 116 may be regarded as a flexible redistribution layer 109. That is, as shown in FIG. 12 to FIG. 14, in some embodiments, the flexible redistribution layer 109 is formed on the back sides of the first LED chip 111, the second LED chip 112, the third LED chip 113, (the control chip 114,) and the flexible composite laminates 103.

Figure 15:
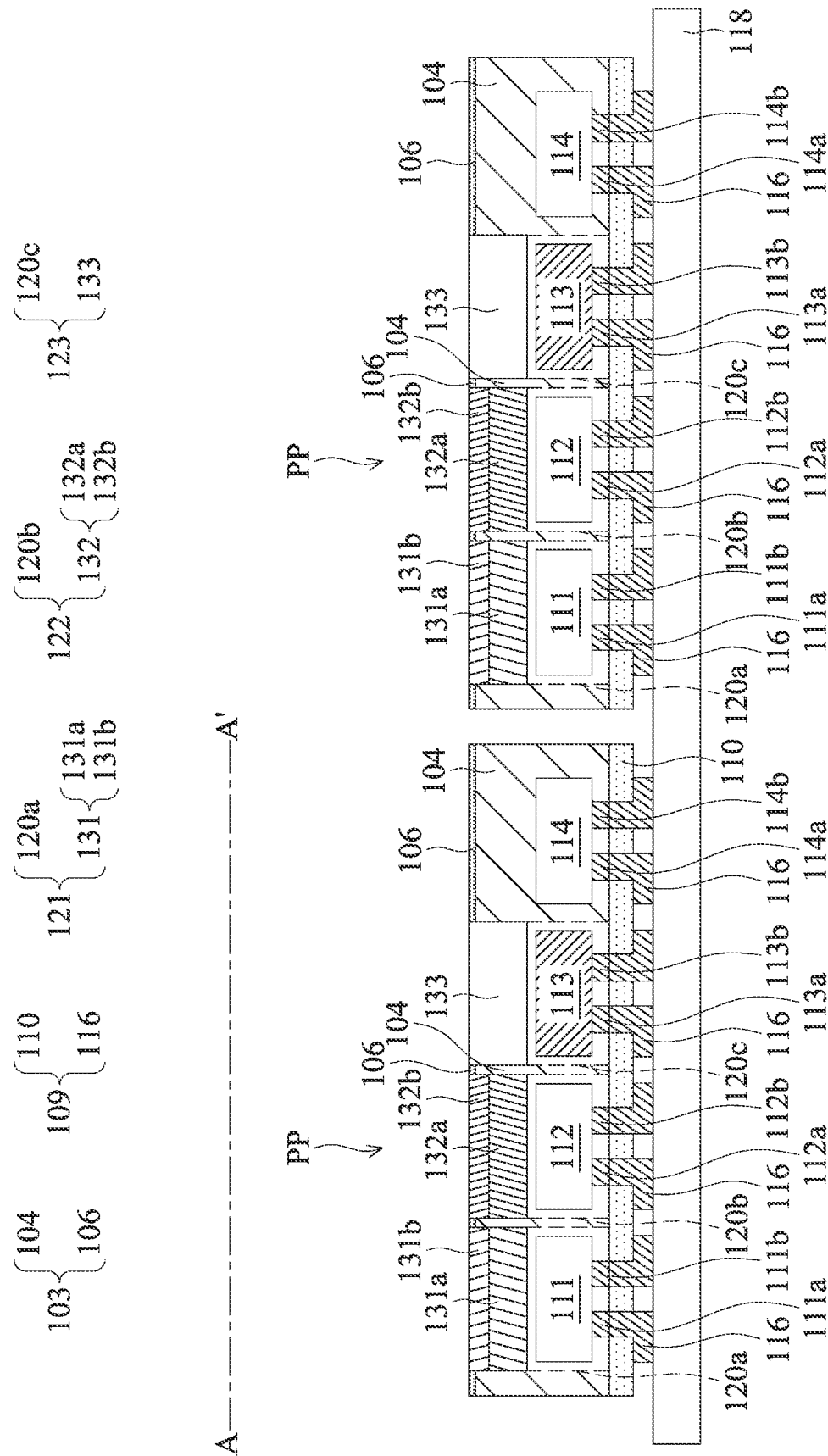

Referring to FIG. 14 and FIG. 15, in some embodiments, the second temporary substrate 108 is removed from the top surfaces of the first light-adjusting layer 121, the second light-adjusting layer 122, the third light-adjusting layer 123, and the flexible composite laminates 103. Then, the first LED chip 111, the second LED chip 112, the third LED chip 113, the control chip 114, the flexible composite laminates 103, and the flexible redistribution layer 109 are transferred onto the dicing substrate 118. The dicing substrate 118 may be the same as or similar to the first temporary substrate 100 or the second temporary substrate 108, which will not be repeated here, but the present disclosure is not limited thereto.

As shown in FIG. 15, the first LED chip 111, the second LED chip 112, the third LED chip 113, the control chip 114, the flexible composite laminates 103 and the flexible redistribution layer 109 are cut into multiple pixel packages PP. In some embodiments, the pixel package PP is a flexible pixel package. As shown in FIG. 15, in some embodiments, the flexible reflection layer 104 is disposed on the flexible redistribution layer 109, and the flexible light-shielding layer 106 is disposed on the flexible reflection layer 104.

Figure 16:
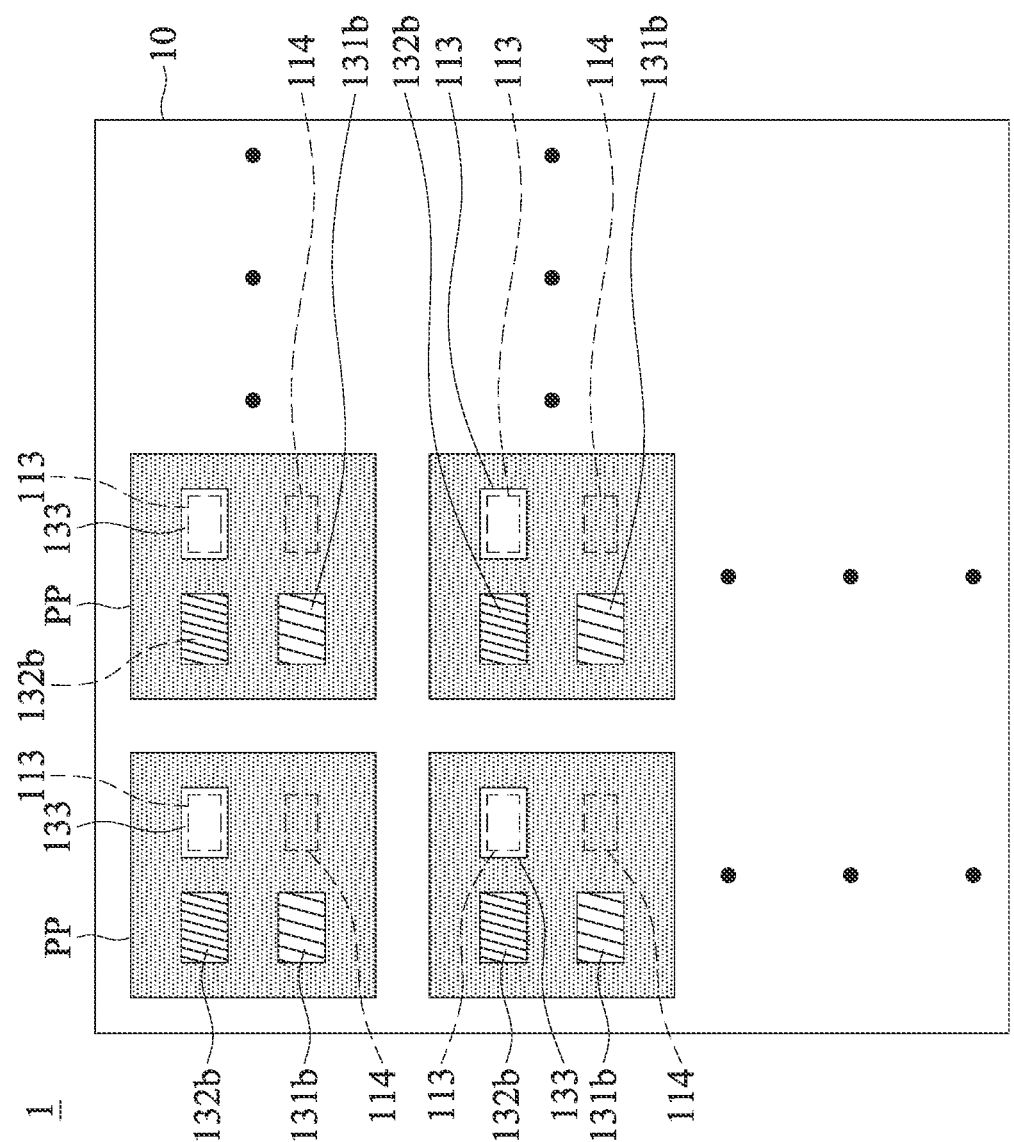
FIG. 16 is a partial top view illustrating a display device using the pixel packages PP according to some embodiments of the present disclosure.

FIG. 16 is a partial top view illustrating a display device 1 using the pixel packages PP according to some embodiments of the present disclosure. Referring to FIG. 16, after forming multiple pixel packages PP (e.g., after the dicing step of FIG. 15 is completed), the pixel packages PP are transferred onto the circuit substrate 10 in large quantities.

For example, the circuit substrate 10 may be, for example, a rigid circuit substrate, which may include elemental semiconductors (e.g., silicon or germanium), compound semiconductors (e.g., silicon carbide (SiC), gallium arsenide (GaAs), indium arsenide (InAs) or indium phosphide (InP)), alloy semiconductors (e.g., SiGe, SiGeC, GaAsP, or GaInP), any other suitable semiconductor, or a combination thereof. The circuit substrate 10 may also be a flexible circuit substrate, a semiconductor-on-insulator (SOI) substrate, or a glass substrate. Moreover, the circuit substrate 10 may include various conductive parts (e.g., conductive lines or vias) (not shown). For example, the aforementioned conductive parts may include aluminum (Al), copper (Cu), tungsten (W), their respective alloys, any other suitable conductive material, or a combination thereof.

Figure 17:
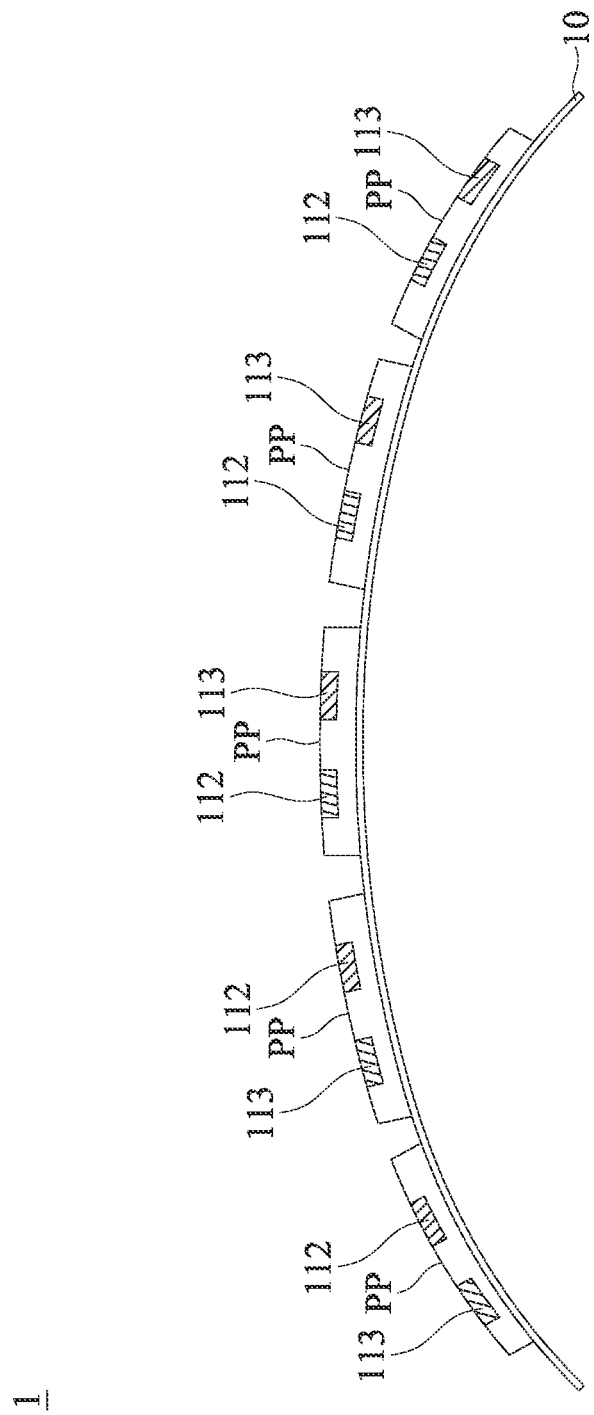
FIG. 17 is a partial cross-sectional view of the display device when the circuit substrate is a flexible circuit substrate according to some embodiments of the present disclosure.

FIG. 17 is a partial cross-sectional view of the display device 1 when the circuit substrate 10 is a flexible circuit substrate according to some embodiments of the present disclosure. In some embodiments, since the flexible redistribution layer is very thin (e.g., the thickness is about 10-50 µm), the flexible composite laminate is an elastic material, and the first LED chip 111, the second LED chip 112, the third LED chip 113, and the control chip 114 are very small (e.g., microchips having a thickness of about 6-15 µm), so that the overall thickness of the pixel package PP may be equal to or less than about 100 µm. Therefore, the pixel package PP may be regarded as a flexible pixel package, which is beneficial to be applied to a flexible display device, such as a wearable display device.

In summary, the pixel structure according to the embodiment of the present disclosure may be an active micro LED pixel package, which can be individually/independently controlled. Moreover, the pixel package according to the embodiment of the present disclosure includes a flexible redistribution layer and flexible composite laminates, which may effectively improve the luminous efficiency of the pixel package and improve the contrast. In some embodiments, the pixel package according to the embodiment of the present disclosure converts the light emitted by the LED chip (e.g., the LED chip that emits ultraviolet light) into light having a specific wavelength through the wavelength conversion layer. Under certain requirements for color uniformity, the pixel package according to the embodiment of the present disclosure has a better process yield than the conventional pixel package, and has the advantages of high color point concentration and small color point shift.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A pixel package, comprising:
a flexible redistribution layer;
a plurality of light-emitting diode chips arranged on a surface of the flexible redistribution layer in a flip-chip manner;
a plurality of light-adjusting layers respectively disposed on the light-emitting diode chips; and
a plurality of flexible composite laminates disposed on the surface of the flexible redistribution layer and between the light-emitting diode chips, wherein each of the flexible composite laminates comprises a flexible reflection layer disposed on the flexible redistribution layer and a flexible light-shielding layer disposed on the flexible reflection layer.

2. The pixel package as claimed in claim 1, further comprising:
a control chip disposed on the surface of the flexible redistribution layer and covered by one of the flexible composite laminates.

3. The pixel package as claimed in claim 1, wherein the light-emitting diode chips emit blue light or ultraviolet light.

4. The pixel package as claimed in claim 3, wherein the light-emitting diode chips comprises a first light-emitting diode chip, a second light-emitting diode chip, and a third light-emitting diode chip respectively emitting a first light, a second light, and a third light, and wherein the light-adjusting layers comprise a first light-adjusting layer, a second light-adjusting layer, and a third light-adjusting layer respectively disposed on the first light-emitting diode chip, the second light-emitting diode chip, and the third light-emitting diode chip.

5. The pixel package as claimed in claim 4, wherein
the first light-adjusting layer, the second light-adjusting layer, and the third light-adjusting layer respectively comprise a first light extraction layer, a second light extraction layer, and a third light extraction layer; and
the first light extraction layer, the second light extraction layer, and the third light extraction layer are respectively disposed on the first light-emitting diode chip, the second light-emitting diode chip, and the third light-emitting diode chip.

6. The pixel package as claimed in claim 5, wherein
the first light-adjusting layer further comprises a first wavelength conversion layer on the first light extraction layer and a first filter layer on the first wavelength conversion layer, wherein the first wavelength conversion layer absorbs part of the first light and converts the first light into red light; and
the second light-adjusting layer further comprises a second wavelength conversion layer on the second light extraction layer and a second filter layer on the second wavelength conversion layer, wherein the second wavelength conversion layer absorbs part of the second light and converts the second light into green light;
wherein the first wavelength conversion layer and the second wavelength conversion layer comprise fluorescent powders, quantum dot materials, or a combination thereof.

7. The pixel package as claimed in claim 6, wherein a top surface of the flexible reflection layer is higher than a top surface of the first wavelength conversion layer and a top surface of the second wavelength conversion layer.

8. The pixel package as claimed in claim 7, wherein a top surface of the flexible light-shielding layer, a top surface of the first filter layer, and a top surface of the second filter layer are coplanar.

9. The pixel package as claimed in claim 7, wherein the flexible reflection layer surrounds at least two-thirds of a thickness of the first filter layer and a thickness of the second filter layer, and the thickness of the first filter layer is calculated from a bottom surface of the first filter layer and the thickness of the second filter layer is calculated from a bottom surface of the second filter layer.

10. The pixel package as claimed in claim 9, wherein a ratio of a thickness of the flexible light-shielding layer to the thickness of the first filter layer or to the thickness of the second filter layer is equal to or smaller than $1/3$.

11. The pixel package as claimed in claim 7, wherein a material of the flexible reflection layer comprises a reflective material and a thermosetting resin, and a material of the flexible light-shielding layer comprises a light-absorbing material and a thermosetting resin.

12. The pixel package as claimed in claim 7, further comprising:
a transparent light extraction layer disposed on the third light extraction layer, wherein a top surface of the transparent light extraction layer, a top surface of the first filter layer, a top surface of the second filter layer, and a top surface of the flexible light-shielding layer are coplanar, and the third light-emitting diode chip emits blue light.

13. The pixel package as claimed in claim 6, wherein the third light-adjusting layer further comprises:
a third wavelength conversion layer disposed on the third light extraction layer, wherein the third wavelength conversion layer absorbs part of the third light and converts the third light into blue light, and the third wavelength conversion comprises fluorescent powders, quantum dot materials or a combination thereof.

14. The pixel package as claimed in claim 1, wherein the flexible redistribution layer comprises a thin insulating layer and a plurality of conductive structures, each of the conductive structures passes through the thin insulating layer from the back side of the thin insulating layer to be electrically connected to a corresponding one of the light-emitting diode chips, and a thickness of the thin insulating layer ranges from 10 to 50 μm.

15. A display device, comprising:
a circuit substrate; and
a plurality of pixel packages disposed on the circuit substrate, wherein each of the pixel packages comprises:
a flexible redistribution layer;
a plurality of light-emitting diode chips arranged on a surface of the flexible redistribution layer in a clip-chip manner;
a plurality of light-adjusting layers respectively disposed on the light-emitting diode chips; and
a plurality of flexible composite laminates disposed on the surface of the flexible redistribution layer and between light-emitting diode chips, wherein each of the flexible composite laminates comprises a flexible reflection layer disposed on the flexible redistribution layer and a flexible light-shielding layer disposed on the flexible reflection layer.

* * * * *